(12) United States Patent
Wu et al.

(10) Patent No.: US 10,546,894 B2
(45) Date of Patent: Jan. 28, 2020

(54) MEMORY DEVICE

(71) Applicant: Samsung Electronics Co., Ltd., Suwon-si (KR)

(72) Inventors: Zhe Wu, Suwon-si (KR); Dong-ho Ahn, Hwaseong-si (KR); Hideki Horii, Seoul (KR); Soon-oh Park, Suwon-si (KR); Jeong-hee Park, Hwaseong-si (KR); Jin-woo Lee, Seoul (KR); Dong-jun Seong, Hwaseong-si (KR); Seol Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/226,855

(22) Filed: Dec. 20, 2018

(65) Prior Publication Data

US 2019/0148456 A1 May 16, 2019

Related U.S. Application Data

(63) Continuation of application No. 15/421,498, filed on Feb. 1, 2017, now Pat. No. 10,224,371.

(30) Foreign Application Priority Data

Jul. 22, 2016 (KR) .......................... 10-2016-0093462

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/126* (2013.01);
(Continued)

(58) Field of Classification Search
CPC . H01L 45/144; H01L 45/143; H01L 45/1233; H01L 27/2427; H01L 27/2481;
(Continued)

(56) References Cited

U.S. PATENT DOCUMENTS 6,795,338 B2 9/2004 Parkinson et al.
7,935,951 B2 5/2011 Czubatyj et al.
(Continued)

FOREIGN PATENT DOCUMENTS

JP 5403565 1/2014
KR 10-1431656 8/2014

*Primary Examiner* — Mouloucoulaye Inoussa
(74) *Attorney, Agent, or Firm* — Muir Patent Law, PLLC

(57) ABSTRACT

A memory device includes a plurality of word lines extending along a first direction and spaced apart from each other along a second direction that is perpendicular to the first direction; a plurality of bit lines extending along the second direction and spaced apart from each other in the first direction, the plurality of bit lines being spaced apart from the plurality of word lines in a third direction that is perpendicular to both the first and second directions; and a plurality of memory cells being respectively arranged between the corresponding word and bit lines. Each of the memory cells includes a selection device layer, and a variable resistance layer, wherein the selection device layer includes a chalcogenide switching material having a composition according to a particular chemical formula.

18 Claims, 21 Drawing Sheets

(52) U.S. Cl.
CPC ........ *H01L 45/1233* (2013.01); *H01L 45/143* (2013.01); *H01L 45/144* (2013.01); *H01L 45/1675* (2013.01)

(58) Field of Classification Search
CPC ....... H01L 45/04; H01L 45/06; H01L 45/141; H01L 45/1253; H01L 45/126; G11C 13/004; G11C 13/003; G11C 2213/71; G11C 2213/74; G11C 2213/76; G11C 7/12; G11C 13/0007; G11C 13/0026; G11C 13/0064; G11C 13/0069
USPC .......... 365/100, 163, 191; 257/2, 4, E27.004
See application file for complete search history.

(56) References Cited

U.S. PATENT DOCUMENTS

| | | |
|---|---|---|
| 7,994,491 B2 | 8/2011 | Campbell |
| 8,148,707 B2 | 4/2012 | Ovshinsky et al. |
| 8,440,535 B2 | 5/2013 | Dennison |
| 8,598,563 B2 | 12/2013 | Sutou et al. |
| 9,337,422 B2 | 5/2016 | Cheong et al. |
| 2010/0163822 A1* | 7/2010 | Ovshinsky ............ C01B 19/002 257/2 |
| 2015/0137061 A1 | 5/2015 | Donghi et al. |
| 2016/0163822 A1* | 6/2016 | Ishikura ................ H01L 29/452 438/571 |
| 2016/0336378 A1 | 11/2016 | Ohba et al. |

\* cited by examiner

MEMORY DEVICE

CROSS-REFERENCE TO RELATED APPLICATION

This application is a continuation application of U.S. patent application Ser. No. 15/421,498, filed Feb. 1, 2017, which claims the benefit of priority to Korean Patent Application No. 10-2016-0093462, filed on Jul. 22, 2016, in the Korean Intellectual Property Office, the disclosures of each of which are incorporated herein in their entirety by reference.

BACKGROUND

The herein described subject matter relates to a memory device, and more particularly, to a memory device including a variable resistance material layer.

As electronic appliances become lighter, thinner, shorter, and smaller, demand for highly integrated semiconductor devices has been increasing. In addition, a three-dimensional (3D) memory device including a variable resistance material layer and a selection device layer and having a crossed point structure has been suggested. As a selection device layer for the 3D memory device, a memory device including a chalcogenide material showing an Ovonic threshold switching characteristic has been suggested.

SUMMARY

Exemplary embodiments of the herein described subject matter provide a memory device having a low off-current and excellent reliability.

According to one exemplary embodiment, there is provided a memory device comprising a variable resistance layer, a selection device layer electrically connected to the variable resistance layer, and a chalcogenide switching material having a composition according to chemical formula 1 below,

$$[Ge_X Si_Y (As_a Te_{1-a})_Z]_{(1-U)} [N]_U \qquad (1)$$

(where $0.05 \le X \le 0.1$, $0.15 \le Y \le 0.25$, $0.7 \le Z \le 0.8$, $X+Y+Z=1$, $0.45 \le a \le 0.6$, and $0.08 \le U \le 0.2$).

According to another exemplary embodiment, there is provided a memory device a memory device comprising a variable resistance layer, a selection device layer electrically connected to the variable resistance layer, and a chalcogenide switching material having a composition according to chemical formula 3 below,

$$Ge_X Si_Y As_Z (Te_b Se_{1-b})_W \qquad (3)$$

(where $0.05 \le X \le 0.1$, $0.15 \le Y \le 0.25$, $0.35 \le Z \le 0.45$, $0.7 \le b \le 1.0$, $0.3 \le W \le 0.4$, and $X+Y+Z+W=1$).

According to yet another exemplary embodiment, there is provided a memory device comprising a plurality of first electrode lines formed on a substrate and extending in a first direction that is in parallel with an upper surface of the substrate, a plurality of second electrode lines formed above the plurality of first electrode lines and extending in a second direction that is in parallel with the upper surface of the substrate and which is different from the first direction, a plurality of third electrode lines formed above the plurality of first electrode lines and extending in the first direction, and a plurality of memory cells respectively formed at points where the plurality of first electrode lines and the plurality of second electrode lines cross one another and the plurality of second electrode lines and the plurality of third electrode lines cross one another. Each of the plurality of memory cells comprises a selection device layer and a variable resistance layer, and the selection device layer comprises a chalcogenide switching material having a composition according to chemical formula 1 or chemical formula 3 below,

$$[Ge_X Si_Y (As_a Te_{1-a})_Z]_{(1-U)} [N]_U \qquad (1)$$

(where $0.05 \le X \le 0.1$, $0.15 \le Y \le 0.25$, $0.7 \le Z \le 0.8$, $X+Y+Z=1$, $0.45 \le a \le 0.6$, and $0.08 \le U \le 0.2$),

$$Ge_X Si_Y As_Z (Te_b Se_{1-b})_W \qquad (3)$$

(where $0.05 \le X \le 0.1$, $0.15 \le Y \le 0.25$, $0.35 \le Z \le 0.45$, $0.7 \le b \le 1.0$, $0.3 \le W \le 0.4$, and $X+Y+Z+W=1$).

BRIEF DESCRIPTION OF THE DRAWINGS

Exemplary embodiment of the herein described subject matter will be more clearly understood from the following detailed description taken in conjunction with the accompanying drawings in which.

DETAILED DESCRIPTION

Figure 1:
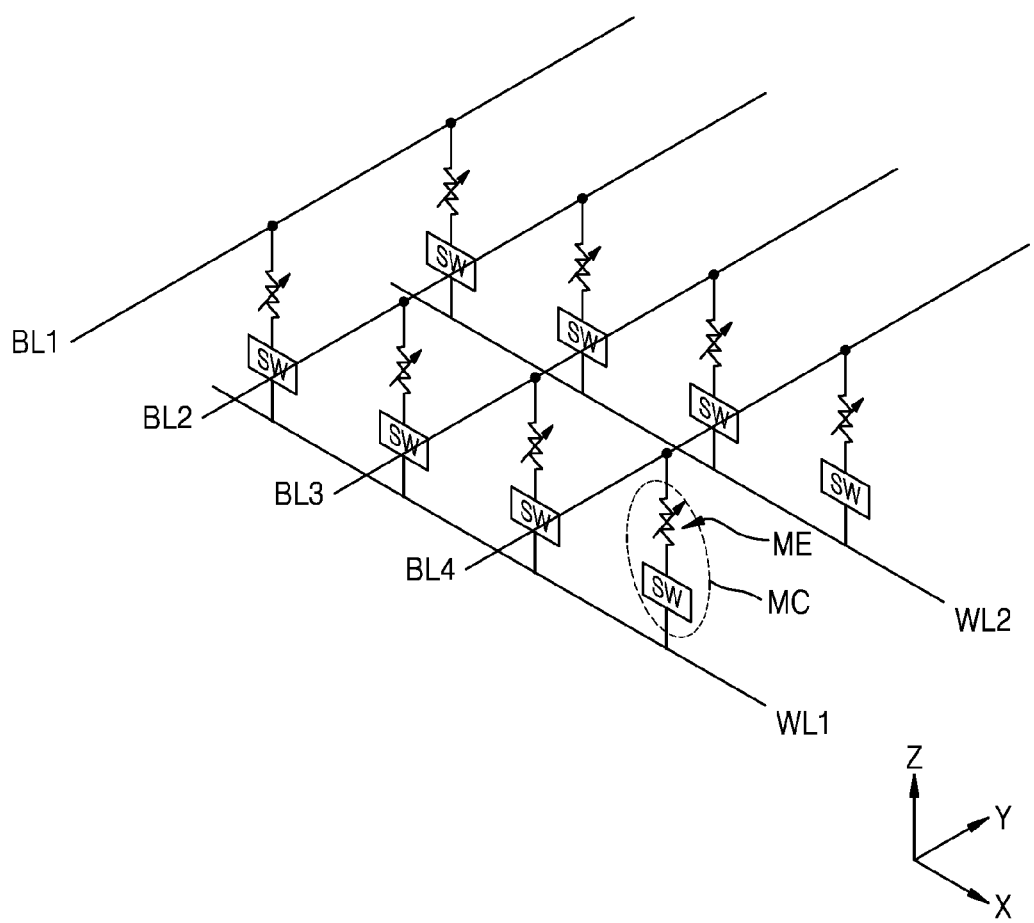
FIG. 1 is an equivalent circuit diagram of a variable resistance memory device according to an exemplary embodiment.

The present disclosure now will be described more fully hereinafter with reference to the accompanying drawings, in which various exemplary implementations are shown. The invention may, however, be embodied in many different forms and should not be construed as limited to the example embodiments. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary implementations, these figures are not necessarily intended to be mutually exclusive from each other. Rather, as will be seen from the context of the detailed description below, certain features depicted and described in different figures can be combined with other features from other figures to result in various exemplary embodiments, when taking the figures and their description as a whole into consideration.

Although the figures described herein may be referred to using language such as "one exemplary embodiment," or "certain exemplary embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Exemplary embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As is traditional in the field of the disclosed technology, features and exemplary implementations are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the exemplary embodiments may be physically combined into more complex blocks, units and/or modules without departing from the scope of the inventive concepts.

FIG. 1 is an equivalent circuit diagram of a variable resistance memory device 100 according to an exemplary embodiment.

As shown in FIG. 1, the variable resistance memory device 100 may include word lines WL1 and WL2 extending along a first direction (X direction) and spaced apart from each other in a second direction (Y direction) that is perpendicular to the first direction. In addition, the variable resistance memory device 100 may include bit lines BL1, BL2, BL3, and BL4 that are spaced apart from the word lines WL1 and WL2 in a third direction (Z direction) and extend along the second direction.

Memory cells MC may be respectively arranged between the bit lines BL1, BL2, BL3, and BL4 and the word lines WL1 and WL2. In detail, the memory cells MC may be arranged at cross points between the bit lines BL1, BL2, BL3, and BL4 and the word lines WL1 and WL2, and may each include a variable resistance layer ME for storing information and a selection device layer SW for selecting a memory cell. In addition, the selection device layer SW may be referred to as a switching device layer or an access device layer.

The memory cells MC may be arranged along the third direction and have the same structures as one another. For example, in the memory cell MC arranged between the word line WL1 and the bit line BL1, the selection device layer SW is electrically connected to the word line WL1, the variable resistance layer ME is electrically connected to the bit line BL1, and the variable resistance layer ME and the selection device layer SW may be connected to each other in series.

However, the exemplary embodiments are not limited to the above described structural arrangement. For example, unlike the FIG. 1 exemplary embodiment, positions of the selection device layer SW and the variable resistance layer ME may be exchanged in the memory cell MC. For example, in the memory cell MC, the variable resistance layer ME may be connected to the word line WL1 and the selection device layer SW may be connected to the bit line BL1.

A method of driving the variable resistance memory device 100 will be described briefly. A voltage is applied to the variable resistance layer ME in the memory cell MC via the word line WL1 or WL2 and the bit line BL1, BL2, BL3, or BL4, so that electric current may flow through the variable resistance layer ME. For example, the variable resistance layer ME may include a phase change material layer that may be reversibly transited between a first phase and a second phase. However, the variable resistance layer ME is not limited thereto, that is, the variable resistance layer ME may include any type of variable resistor having a resistance value varying depending on an applied voltage. For example, in a selected memory cell MC, the resistance of the variable resistance layer ME may be reversibly transited between the first phase and the second phase according to a voltage applied to the variable resistance layer ME.

According to the resistance variation of the variable resistance layer ME, the memory cell MC may store digital information represented as '0' or '1' or may erase digital information from the memory cell MC. For example, data may be written as a high resistance state '0' and a low resistance state '1' in the memory cell MC. Here, writing of data from the high resistance state '0' to the low resistance state '1' may be referred to as a 'set operation', and writing of data from the low resistance state '1' to the high resistance state '0' may be referred to as a 'reset operation'. However, the memory cell MC according to exemplary embodiments is not limited to the digital information of the high resistance state '0' and the low resistance state '1' as described above, but may store various resistance states.

An arbitrary memory cell MC may be addressed by selecting the word lines WL1 and WL2 and the bit lines BL1, BL2, BL3, and BL4, and the memory cell MC may be programmed by applying a predetermined signal between the word lines WL1 and WL2 and the bit lines BL1, BL2, BL3, and BL4. In addition, a current value may be measured via the bit lines BL1, BL2, BL3, and BL4 so as to read information according to the resistance value of the variable resistance layer in the corresponding memory cell MC, that is, programmed information.

Figure 2:
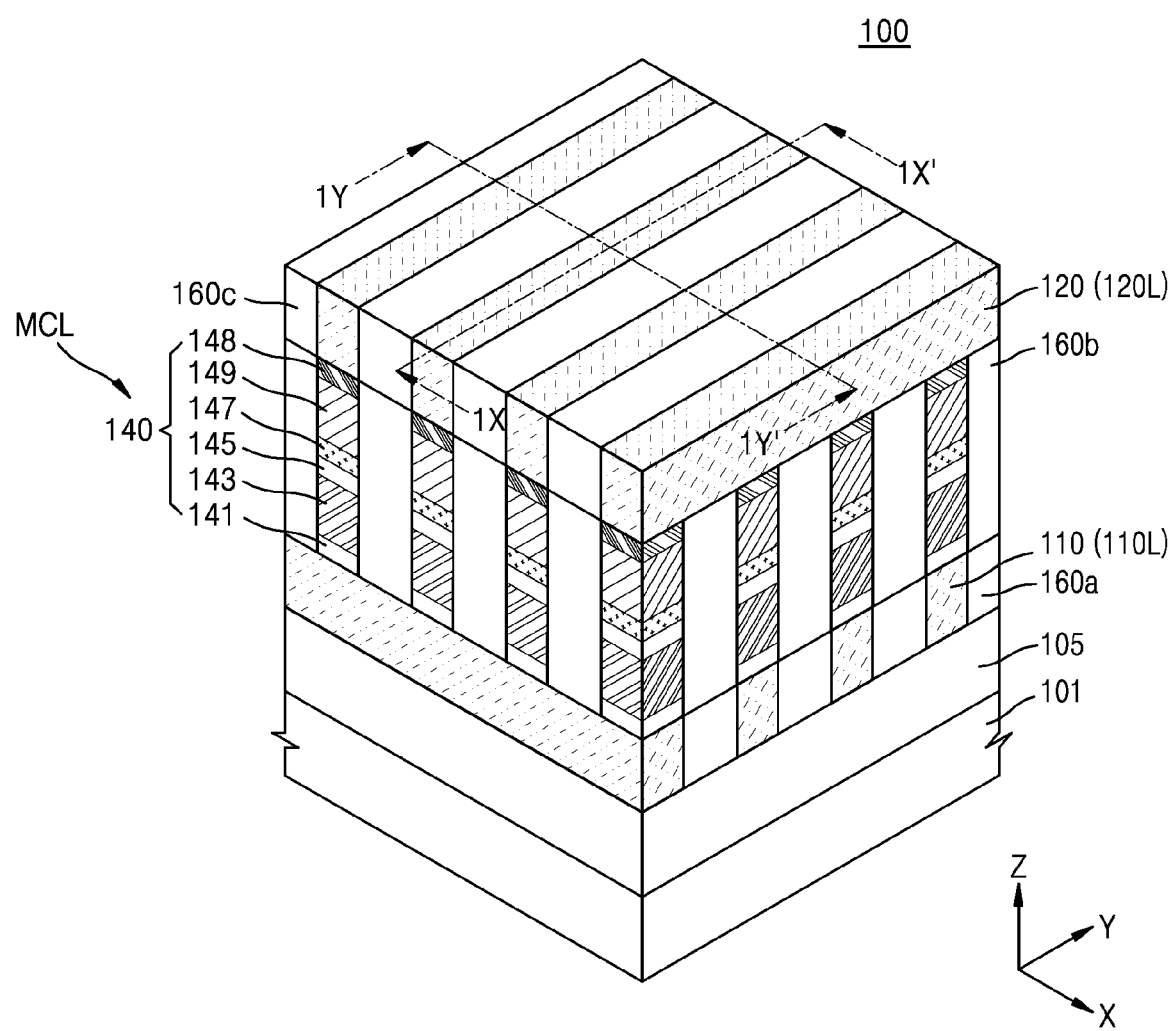
FIG. 2 is a perspective view of a variable resistance memory device according to an exemplary embodiment.
Figure 3:
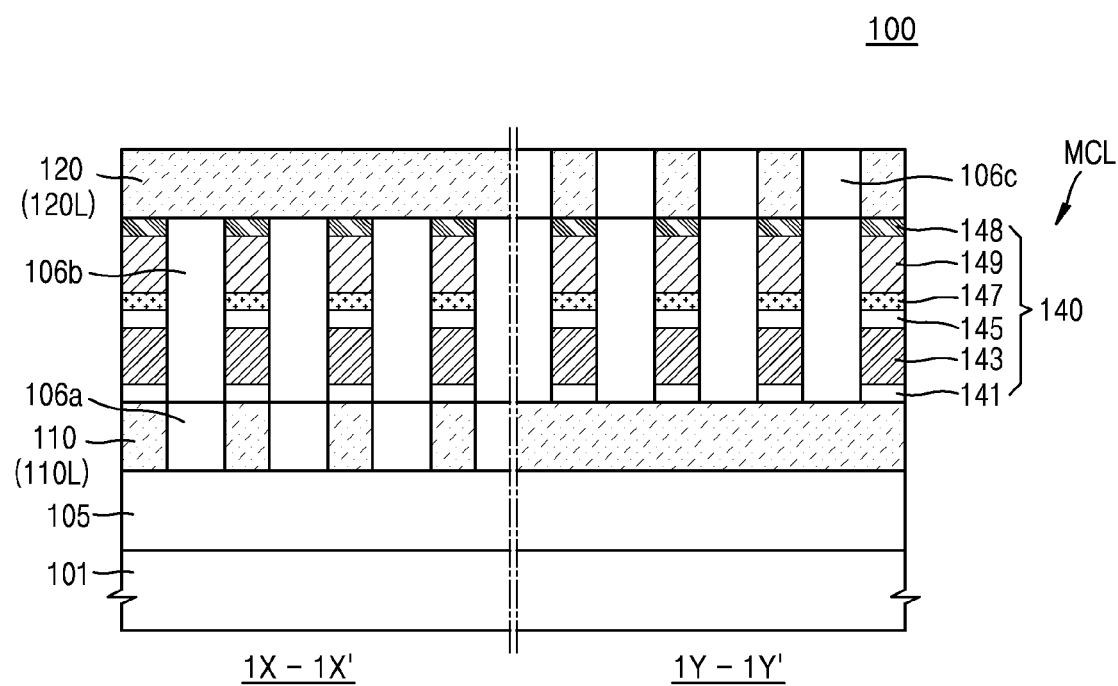
FIG. 3 is a cross-sectional view taken along lines 1X-1X' and 1Y-1Y' of FIG. 2.

FIG. 2 is a perspective view of the variable resistance memory device according to an exemplary embodiment, and FIG. 3 is a cross-sectional view taken along lines 1X-1X' and 1Y-1Y' of FIG. 2.

As shown in FIGS. 2 and 3, the variable resistance memory device 100 may include a first electrode line layer 110L, a second electrode line layer 120L, and a memory cell layer MCL on a substrate 101.

As shown in the drawings, an interlayer insulating layer 105 may be arranged on the substrate 101. The interlayer insulating layer 105 may include an oxide material such as silicon oxide or a nitride material such as silicon nitride, and electrically separate the first electrode line layer 110L from the substrate 101. In the variable resistance memory device 100 of the exemplary embodiment, the interlayer insulating layer 105 is arranged on the substrate 101, but this is a non-limiting example. For example, in the variable resistance memory device 100 according to another exemplary embodiment, an integrated circuit layer may be arranged on the substrate 101, and memory cells may be arranged on the integrated circuit layer. The integrated circuit layer may include, for example, a peripheral circuit for operating the memory cells and/or a core circuit for performing operations. A structure, in which the integrated circuit layer including the peripheral circuit and/or the core circuit is arranged on the substrate and the memory cells are arranged above the integrated circuit layer, may be referred to as a cell over peri (COP) structure.

The first electrode line layer 110L may include a plurality of first electrode lines 110 that extend along the first direction (X direction) in parallel with one another. The second electrode lines 120L may include a plurality of second electrode lines 120 that extend in the second direction (Y direction) in parallel with one another and crossing the first direction. The first direction and the second direction may be perpendicular to each other.

When it comes to driving of the variable resistance memory device 100, the first electrode lines 110 may correspond to the word lines WL (see FIG. 1), and the second electrode lines 120 may correspond to the bit lines BL (see FIG. 1). Alternatively, the first electrode lines 110 may correspond to the bit lines, and the second electrode lines 120 may correspond to the word lines.

The first electrode lines 110 and the second electrode lines 120 may each include metal, conductive metal nitride, conductive metal oxide, or a combination thereof. For example, the first electrode lines 110 and the second electrode lines 120 may each include W, WN, Au, Ag, Cu, Al, TiAlN, Ir, Pt, Pd, Ru, Zr, Rh, Ni, Co, Cr, Sn, Zn, indium tin oxide (ITO), an alloy thereof, or a combination thereof. In addition, the first electrode line 110 and the second electrode lines 120 may each include a metal layer, and a conductive barrier layer covering at least partially the metal layer. The conductive barrier layer may include, for example, Ti, TiN, Ta, TaN, or a combination thereof.

The memory cell layer MCL may include a plurality of memory cells 140 (MC of FIG. 1) that are spaced apart from one another in the first direction and the second direction. As shown in FIGS. 2 and 3, the first electrode lines 110 and the second electrode lines 120 may cross each other. The memory cells 140 may be arranged on portions where the first electrode lines 110 and the second electrode lines 120 cross each other, between the first electrode line layer 110L and the second electrode line layer 120L.

The memory cells 140 may be formed to have square pillar structures, but are not limited thereto. For example, the memory cells 140 may have various types of pillar shapes such as cylinders, oval pillars, and polygonal pillars. In addition, the memory cells 140 may each have a structure, in which a lower portion is wider than an upper portion, or a structure in which an upper portion is wider than a lower portion, according to a forming method used. For example, when the memory cells 140 are formed by performing an etching process, a lower portion of each memory cell 140 may be wider than an upper portion thereof. In addition, if the memory cells 140 are formed by performing a damascene process, an upper portion of each memory cell 140 may be wider than a lower portion thereof. During the etching process or the damascene process, the etching may be controlled accurately so that material layers may be etched to have nearly vertical side surfaces, and the upper and lower portions are nearly the same as each other in terms of width. In the drawings, including FIGS. 2 and 3, the memory cells 140 are shown to have vertical side surfaces for convenience of description, but the memory cells 140 may each have the structure, in which the lower portion is wider than the upper portion or the upper portion is wider than the lower portion.

Each of the memory cells 140 may include a lower electrode layer 141, a selection device layer 143, an intermediate electrode layer 145, a heating electrode layer 147, a variable resistance layer 149, and an upper electrode layer

148. Without taking into account locations of the above layers, the lower electrode layer 141 may be referred to as a first electrode layer, the intermediate electrode layer 145 and the heating electrode layer 147 may be referred to as a second electrode layer, and the upper electrode layer 148 may be referred to as a third electrode layer.

In some embodiments, the variable resistance layer 149 (ME of FIG. 1) may include a phase change material that reversibly changes between an amorphous state and a crystalline state. For example, the variable resistance layer 149 may include a material, a phase of which may be reversibly changed due to Joule heat generated by voltages applied to opposite terminals of the variable resistance layer 149 and a resistance of which varies depending on the phase change. In detail, the phase change material may be in a high resistance state when it is in the amorphous phase, and in a low resistance state when it is in the crystalline phase. By defining the high resistance state as '0' and the low resistance state as '1', data may be stored in the variable resistance layer 149.

In some embodiments, the variable resistance layer 149 may include a chalcogenide material as the phase change material. For example, the variable resistance layer 149 may include Ge—Sb—Te (GST). Here, a chemical composition expression with hyphens (-) expresses elements included in a certain mixture or a compound, and may denote all kinds of chemical formula structures including the expressed elements. For example, Ge—Sb—Te may include $Ge_2Sb_2Te_5$, $Ge_2Sb_2Te_7$, $Ge_1Sb_2Te_4$, and $Ge_1Sb_4Te_7$.

The variable resistance layer 149 may include various chalcogenide materials, in addition to the above-described Ge—Sb—Te (GST). For example, the variable resistance layer 149 may include at least two selected from silicon (Si), germanium (Ge), antimony (Sb), tellurium (Te), bismuth (Bi), indium (In), tin (Sn), and selenium (Se), or a combination thereof, as the chalcogenide material.

Each element included in the variable resistance layer 149 may have various stoichiometric ratios. A crystallization temperature, a melting point, a phase shift speed according to crystallization energy, and information retention of the variable resistance layer 149 may be adjusted according to the stoichiometry of each element. In exemplary embodiments, a melting point of the chalcogenide material included in the variable resistance layer 149 may be about 500° C. to about 800° C.

In addition, the variable resistance layer 149 may further include at least one impurity selected from boron (B), carbon (C), nitrogen (N), oxygen (O), phosphor (P), and sulfur (S). A driving current of the variable resistance memory device 100 may vary depending on the impurity. In addition, the variable resistance layer 149 may further include metal. For example, the variable resistance layer 149 may include at least one selected from aluminum (Al), gallium (Ga), zinc (Zn), titanium (Ti), chrome (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), and polonium (Po). Such above metal materials may increase electric conductivity and thermal conductivity of the variable resistance layer 149, thereby increasing a crystallization speed and setting speed. In addition, the metal materials may improve the information retention property of the variable resistance layer 149.

The variable resistance layer 149 may have a multi-layered structure, in which two or more layers having different physical properties from each other are stacked. The number of layers or a thickness of each layer may be freely selected. A barrier layer may be further formed between the layers. The barrier layer may prevent materials from dispersing among the plurality of layers. That is, the barrier layer may reduce diffusion of a preceding layer when a successive layer is formed, from among the plurality of layers.

In addition, the variable resistance layer 149 may have a super-lattice structure in which a plurality of layers including different materials from one another are alternatively stacked. For example, the variable resistance layer 149 may have a structure, in which a first layer including Ge—Te and a second layer including Sb—Te are alternately stacked. However, the first layer and the second layer are not limited thereto, that is, the first and second layers may include the various above-described materials.

In the above description, the phase change material is exemplarily provided as the variable resistance layer 149, but other exemplary embodiments are not limited thereto. The variable resistance layer 149 of the variable resistance memory device 100 may include various materials having variable resistance characteristics.

In some exemplary embodiments, if the variable resistance layer 149 includes a transition metal oxide, the variable resistance memory device 100 may be a resistive random access memory (ReRAM). In the variable resistance layer 149 including the transition metal oxide, at least one electrical path may be generated or extinguished by a programming operation. When the electrical path is generated, the variable resistance layer 149 may have a low resistance value, and when the electrical path is extinguished, the variable resistance layer 149 may have a high resistance value. The variable resistance memory device 100 may store data by using the difference between the resistance values of the variable resistance layer 149. For example, the high resistance value could indicate a stored "0" and the low resistance value could indicate a stored "1."

When the variable resistance layer 149 includes the transition metal oxide, the transition metal oxide may include at least one metal selected from Ta, Zr, Ti, Hf, Mn, Y, Ni, Co, Zn, Nb, Cu, Fe, and Cr. For example, the transition metal oxide may have a single-layered structure or a multi-layered structure including at least one selected from $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In the above examples, x and y may be respectively selected within a range of $0 \leq x \leq 1.5$ and a range of $0 \leq y \leq 0.5$, but are not limited thereto.

In exemplary embodiments, when the variable resistance layer 149 has a magnetic tunnel junction (MRJ) structure including two electrodes formed of magnetic materials and a dielectric material arranged there-between, the variable resistance memory device 100 may be a magnetic RAM (MRAM).

The above two electrodes may be respectively a pinned magnetization layer and a free magnetization layer, and the dielectric material arranged between the two electrodes may be a tunnel barrier layer. The pinned magnetization layer has a magnetization direction fixed in a certain direction, and the free magnetization layer has a magnetization direction that is either parallel or anti-parallel with the magnetization direction of the pinned magnetization layer. The magnetization directions of the pinned magnetization layer and the free magnetization layer may be in parallel with a surface of the tunnel barrier layer, but are not limited thereto. That is, the magnetization directions of the pinned magnetization layer and the free magnetization layer may be perpendicular to the surface of the tunnel barrier layer.

In a case where the magnetization direction of the free magnetization layer is in parallel with the magnetization direction of the pinned magnetization layer, the variable resistance layer 149 may have a first resistance value. In addition, in a case where the magnetization direction of the free magnetization layer is not in parallel with the magnetization direction of the pinned magnetization layer, the variable resistance layer 149 may have a second resistance value. By using the variation in the resistance value, the variable resistance memory device 100 may store data. The magnetization direction of the free magnetization layer may be changed by spin torque of electrons in a programming current.

The pinned magnetization layer and the free magnetization layer may have a magnetic material. Here, the pinned magnetization layer may further include an anti-ferromagnetic material for fixing the magnetization direction of a ferromagnetic material in the pinned magnetization layer. The tunnel barrier layer may include an oxide material selected from Mg, Ti, Al, MgZn, and MgB, but is not limited thereto.

The selection device layer 143 (SW of FIG. 1) may be a current adjustment layer that may control a flow of the electric current. The selection device layer 143 may include a material layer, a resistance of which may vary depending on a magnitude of a voltage applied to opposite terminals of the selection device layer 143. For example, the selection device layer 143 may include an Ovonic threshold switching (OTS) material. Functions of the selection device layer 143 based on the OTS material will be described briefly below. That is, when a voltage that is less than a threshold voltage $V_T$ is applied to the selection device layer 143, the selection device layer 143 is maintained at a high resistance state, that is, electric current rarely flows through the selection device layer 143. In addition, when a voltage that is greater than the threshold voltage $V_T$ is applied to the selection device layer 143, the selection device layer 143 enters the low resistance state and the electric current starts to flow. In addition, when the electric current flowing through the selection device layer 143 is less than a holding current, the selection device layer 143 may shift to the high resistance state. In addition, an Ovonic threshold switching property of the selection device layer 143 will be described in detail later with reference to FIG. 4.

The selection device layer 143 may include a chalcogenide switching material as the OTS material. In exemplary embodiments, the selection device layer 143 may include a quaternary chalcogenide switching material including Ge, Si, As, and Te, and the quaternary chalcogenide switching material may further include N. For example, the selection device layer 143 may include a chalcogenide switching material having a composition according to chemical formula 1 below.

(herein, $0.05 \leq X \leq 0.1$, $0.15 \leq Y \leq 0.25$, $0.7 \leq Z \leq 0.8$, $X+Y+Z=1$, $0.45 \leq a \leq 0.6$, and $0.08 \leq U \leq 0.2$)

In exemplary embodiments, the quaternary chalcogenide switching material may include Ge in an amount of about 5% to about 10% (for example, X may be 0.05 to 0.1 in the chemical formula 1 above). Here, a chalcogenide switching material having a composition of $Ge_X Si_Y (As_a Te_{1-a})_Z$ will be referred to as the quaternary chalcogenide switching material. For example, the chalcogenide switching material having the composition according to the chemical formula 1 above may further include N in addition to the quaternary chalcogenide switching material. In some examples, the quaternary chalcogenide switching material may include Ge in an amount of about 6% to about 8% (for example, X may be 0.06 to 0.08 in the chemical formula 1 above). It is understood that thermal stability of the chalcogenide switching material may be improved and stable switching characteristics may be exhibited when a predetermined amount of Ge is contained in the chalcogenide switching material. For example, when the quaternary chalcogenide switching material includes Ge in an amount less than about 5%, the thermal stability of the chalcogenide switching material may not be excellent, e.g., the thermal stability may not be sufficiently high enough to be used in the memory device having a cross-point structure. On the other hand, when the quaternary chalcogenide switching material includes Ge in an amount greater than about 10%, amorphization tendency of the chalcogenide switching material increases, and thus, the chalcogenide switching material may not exhibit a stabilized switching characteristic.

In exemplary embodiments, the quaternary chalcogenide switching material may include Si in an amount of about 15% to about 25% (for example, Y may be 0.15 to 0.25 in the chemical formula 1 above). In some exemplary embodiments, the quaternary chalcogenide switching material may include Si in an amount of about 17% to about 22% (for example, Y may be 0.17 to 0.22 in the chemical formula 1 above). When a predetermined amount of Si is contained in the chalcogenide switching material, leakage current (or off-current $I_{off}$) of the chalcogenide switching material may be reduced. For example, when the quaternary chalcogenide switching material includes Si in an amount greater than about 15%, the off-current of the chalcogenide switching material may be reduced. When the quaternary chalcogenide switching material includes Si in an amount exceeding about 25%, a content amount of Ge that may be included in the quaternary chalcogenide switching material for implementing stabilized switching characteristics may be reduced, and accordingly, the thermal stability of the chalcogenide switching material may be decreased.

In exemplary embodiments, a sum of the content amounts of Ge and Si in the quaternary chalcogenide switching material may be about 20% to about 30% (for example, a sum of X and Y may be 0.2 to 0.3 in the chemical formula 1 above). For example, when the sum of the content amounts of Ge and Si is greater than about 30%, the chalcogenide switching material may not exhibit stabilized switching characteristics due to a covalent bonding characteristic of Ge and Si.

In exemplary embodiments, the quaternary chalcogenide switching material may include a metal compound of As and Te (e.g., $As_a Te_{1-a}$) in an amount of about 70% to about 80%, wherein 'a' may range from about 0.45 to about 0.6 (e.g., Z may be 0.7 to 0.8 in the chemical formula 1 above). That is, the quaternary chalcogenide switching material may include As and Te, so that a ratio of As with respect to an entire atom amount of As and Te is about 0.45 to about 0.6. For example, the quaternary chalcogenide switching material may include As in an amount of about 32% to about 48%, and Te in an amount of about 28% to about 44%.

It is understood that a leakage current of the quaternary chalcogenide switching material is reduced as the content amount of As in the metal compound of As and Te becomes greater. On the other hand, if the content amount of Te is too small (e.g., a is greater than 0.6), the quaternary chalcogenide switching material may not exhibit stabilized switching characteristics. In some exemplary embodiments, the quaternary chalcogenide switching material may include As in an amount of about 40% to about 45% and Te in an amount of about 30% to about 35%. However, one or more exemplary embodiments are not limited thereto. A leakage current characteristic of the chalcogenide switching material according to exemplary embodiments will be described later with reference to FIGS. 6A to 6C.

In exemplary embodiments, the chalcogenide switching material may further include N in an amount of about 8% to about 20% as shown in the chemical formula 1 above (e.g., U may be 0.08 to 0.2 in the chemical formula 1 above). In some exemplary embodiments, the chalcogenide switching material may include N in an amount of about 15% to about 20% (e.g., U may be 0.15 to 0.2 in the chemical formula 1 above). Since the chalcogenide switching material includes N, the content amount of each of Ge, Si, As, and Te in the chalcogenide switching material may be reduced according to the amount of N. For example, the chalcogenide switching material may have a composition of $[Ge_{0.08}Si_{0.17}As_{42.2}Te_{32.8}]_{0.82}[N]_{0.18}$ or $[Ge_{0.08}Si_{0.17}As_{42.2}Te_{32.8}]_{0.86}[N]_{0.14}$, but is not limited thereto. As the amount of N included in the chalcogenide switching material becomes greater (e.g., N in an amount of 8% or greater), the leakage current of the chalcogenide switching material may decrease. However, when the amount of N exceeds about 20%, the amount of each of Ge, Si, As, and Te included in the chalcogenide switching material is decreased, and as a result stabilized switching characteristics may not be obtained.

In other exemplary embodiments, the selection device layer 143 may include a chalcogenide switching material that includes Ge, Si, As, Te, and N, and further includes carbon (C). For example, the selection device layer 143 may include the chalcogenide switching material having a composition according to chemical formula 2 below.

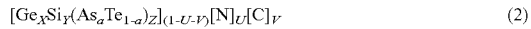

$$[Ge_XSi_Y(As_aTe_{1-a})_Z]_{(1-U-V)}[N]_U[C]_V \quad (2)$$

(where $0.05 \leq X \leq 0.1$, $0.15 \leq Y \leq 0.25$, $0.7 \leq Z \leq 0.8$, $X+Y+Z=1$, $0.45 \leq a \leq 0.6$, $0.08 \leq U \leq 0.2$, and $0.01 \leq V \leq 0.15$)

In exemplary embodiments, the chalcogenide switching material may include N in an amount of about 8% to about 20% and C in an amount of about 1% to about 15%, as shown in the chemical formula 2 above (e.g., U may be 0.08 to 0.2 and V may be 0.01 to 0.15 in the chemical formula 2 above). In some exemplary embodiments, the chalcogenide switching material may include N in an amount of about 10% to about 15% and C in an amount of about 4% to about 10% (e.g., U may be 0.1 to 0.15 and V may be 0.04 to 0.1 in the chemical formula 2 above). For example, the chalcogenide switching material may have a composition such as $[Ge_{0.08}Si_{0.17}As_{42.2}Te_{32.8}]_{0.86}[N]_{0.10}[C]_{0.04}$, $[Ge_{0.08}Si_{0.17}As_{42.2}Te_{32.8}]_{0.82}[N]_{0.14}[C]_{0.04}$, or $[Ge_{0.08}Si_{0.17}As_{42.2}Te_{32.8}]_{0.82}[N]_{0.10}[C]_{0.08}$, but is not limited thereto.

It is understood that N or C included in the chalcogenide switching material reduces the leakage current of the chalcogenide switching material. For example, N or C may reduce a carrier hopping site in the chalcogenide switching material, and accordingly, the leakage current of the selection device layer 143 including the chalcogenide switching material may be reduced. In addition, N or C included in the chalcogenide switching material may restrain generation or growth of a core (or a nucleation seed) in the chalcogenide switching material, and accordingly, the chalcogenide switching material may have a crystallization temperature that has risen and thermal stability of the chalcogenide switching material may be improved. For example, the chalcogenide switching material may have a high crystallization temperature of about 350° C. to about 450° C., and thus, damage to the chalcogenide switching material or degradation of the chalcogenide switching material may be prevented during the manufacturing processes of a variable resistance memory device having a cross-point structure by using the chalcogenide switching material. In addition, the leakage current characteristic and the thermal stability of the chalcogenide switching material according to exemplary embodiments will be described later with reference to FIGS. 6A to 6C.

In other exemplary embodiments, the selection device layer 143 may include a chalcogenide switching material including Ge, Si, As, Te, and Se. For example, the selection device layer 143 may include a chalcogenide switching material having a composition according to chemical formula 3 below.

$$Ge_XSi_YAs_Z(Te_bSe_{1-b})_W \quad (3)$$

(where $0.05 \leq X \leq 0.1$, $0.15 \leq Y \leq 0.25$, $0.35 \leq Z \leq 0.45$, $0.7 \leq b \leq 1.0$, $0.3 \leq W \leq 0.4$, and $X+Y+Z+W=1$)

In exemplary embodiments, the chalcogenide switching material may have a composition that is obtained by substituting Te in the quaternary chalcogenide switching material having a composition of $Ge_XSi_YAs_ZTe_W$ with Se. The chalcogenide switching material may include a metal compound of Te and Se (e.g., $Te_bSe_{1-b}$) in an amount of about 30% to about 40% (for example, W may be 0.3 to 0.4 in the chemical formula 3 above), wherein b may be equal to or greater than about 0.7 and less than 1.0. That is, the chalcogenide switching material may include Te and Se, so that a ratio of Se with respect to an entire atomic amount of Te and Se is greater than 0 and equal to or less than 0.3 (otherwise, less than 30% of the atomic amount of Te may be replaced with Se). For example, the chalcogenide switching material may include Se in an amount greater than about 0% and equal to or less than 10% and Te in an amount of about 21% to about 40%. In some exemplary embodiments, the chalcogenide switching material may include Se in an amount of about 3.5% to about 8% and Te in an amount of about 24% to about 28%.

When the chalcogenide switching material includes Se substituting for the part of Te, it is understood that the leakage current of the chalcogenide switching material is decreased. In general, Te may be a main component allowing the chalcogenide switching material to show the Ovonic threshold switching characteristic, but as the amount of Te increases, the leakage current, e.g., electric current flowing through the chalcogenide switching material in an off-state (here, the leakage current in the off-state is referred to as off-current) is relatively greater. However, when Se substituting for the part of Te is included in the chalcogenide switching material, the off-current may be decreased. When Se is included in the chalcogenide switching material in an amount greater than about 10% (also, the chalcogenide switching material includes Si), a total amount of Si and Se included in the chalcogenide switching material may increase. With such increased materials, the chalcogenide switching material may exhibit increased threshold voltage and/or unstable switching characteristics.

In exemplary embodiments, the selection device layer 143 may include a chalcogenide switching material including Ge, Si, As, Te, and Se and further including at least one of N and C. For example, the selection device layer 143 may include a chalcogenide switching material having a composition according to chemical formula 4 or 5 below.

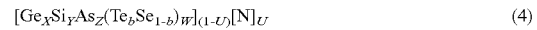

$$[Ge_XSi_YAs_Z(Te_bSe_{1-b})_W]_{(1-U)}[N]_U \quad (4)$$

(where $0.05 \leq X \leq 0.1$, $0.15 \leq Y \leq 0.25$, $0.35 \leq Z \leq 0.45$, $0.7 \leq b \leq 1.0$, $0.3 \leq W \leq 0.4$, $X+Y+Z+W=1$, and $0.08 \leq U \leq 0.2$)

$$[Ge_X Si_Y As_Z (Te_b Se_{1-b})_W]_{(1-U-V)}[N]_U[C]_V \quad (5)$$

(where $0.05 \leq X \leq 0.1$, $0.15 \leq Y \leq 0.25$, $0.35 \leq Z \leq 0.45$, $0.7 \leq b \leq 1.0$, $0.3 \leq W \leq 0.4$, $X+Y+Z+W=1$, $0.08 \leq U \leq 0.2$, and $0.01 \leq V \leq 0.15$)

As described above, the selection device layer 143 may include the chalcogenide switching material having the composition according to the chemical formula 1, 2, 3, 4, or 5 above, and the chalcogenide switching material may represent stabilized switching characteristics, low off-current, excellent thermal stability, and excellent durability.

The heating electrode layer 147 may be arranged between the intermediate electrode layer 145 and the variable resistance layer 149 to contact the variable resistance layer 149. The heating electrode layer 147 may heat the variable resistance layer 149 during a set or reset operation. The heating electrode layer 147 may include a conductive material that may generate heat that is sufficient enough to cause a phase change of the variable resistance layer 149 without reacting with the variable resistance layer 149. The heating electrode layer 149 may include a carbon-based conductive material. In some exemplary embodiments, the heating electrode layer 147 may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, silicon carbide (SiC), silicon carbon nitride (SiCN), carbon nitride (CN), titanium carbon nitride (TiCN), tantalum carbon nitride (TaCN), a refractory metal combination or nitride thereof. However, the heating electrode layer 147 is not limited to the above examples.

The lower electrode layer 141, the intermediate electrode layer 145, and the upper electrode layer 148 may function as current paths, and may include a conductive material. For example, the lower electrode layer 141, the intermediate electrode layer 145, and the upper electrode layer 148 may each include metal, conductive metal nitride, conductive metal oxide, or a combination thereof. For example, the lower electrode layer 141, the intermediate electrode layer 145, and the upper electrode layer 148 may each include at least one selected from C, TiN, TiSiN, TiCN, TiCSiN, TiAlN, Ta, TaN, W, and WN, but are not limited thereto.

The lower electrode layer 141 and the upper electrode layer 148 may be selectively formed. That is, the lower electrode layer 141 and the upper electrode layer 148 may be omitted. However, in order to prevent contamination or defective contact that may be caused when the selection device layer 143 and the variable resistance layer 149 directly contact the first and second electrode lines 110 and 120, the lower electrode layer 141 and the upper electrode layer 148 may be arranged between the first and second electrode lines 110 and 120 and the selection device layer 143 and the variable resistance layer 149.

In addition, the intermediate electrode layer 145 has to be provided in order to prevent heat from transferring to the selection device layer 143 from the heating electrode layer 147. In general, the selection device layer 143 may include a chalcogenide switching material in an amorphous state. However, according to a down-scaling tendency of the variable resistance memory device 100, a thickness and a width of each of the variable resistance layer 149, the selection device layer 143, the heating electrode layer 147, and the intermediate electrode layer 145 and distances therebetween may be reduced. Therefore, while driving the variable resistance memory device 100, when the heating electrode layer 147 generates heat to cause the phase change of the variable resistance layer 149, the selection device layer 143 arranged adjacent to the heating electrode layer 147 may be affected by the heat. For example, the selection device layer 143 may be partially crystallized by the heat from the adjacent heating electrode layer 147, that is, the selection device layer 143 may degrade or may be damaged.

In exemplary embodiments, the intermediate electrode layer 145 may be formed thick so as not to transfer the heat from the heating electrode layer 147 to the selection device layer 143. In FIGS. 2 and 3, the intermediate electrode layer 145 has a thickness that is similar to that of the lower electrode layer 141 or the upper electrode layer 148, but the thickness of the intermediate electrode layer 145 may be greater than that of the lower electrode layer 141 or the upper electrode layer 148 for facilitating the heat blocking operation. For example, the intermediate electrode layer 145 may have a thickness of about 10 nm to about 100 nm, but is not limited thereto. Also, the intermediate electrode layer 145 may include at least one thermal barrier layer for the heat blocking function. When the intermediate electrode layer 145 includes two or more thermal barrier layers, the intermediate electrode layer 145 may have a structure, in which the thermal barrier layers and electrode material layers are alternately stacked.

A first insulating layer 160a is arranged among the first electrode lines 110, and a second insulating layer 160b may be arranged among the memory cells 140 of the memory cell layer MCL. In addition, a third insulating layer 160c may be arranged among the second electrode lines 120. The first to third insulating layers 160a to 160c may be insulating layers including the same material as each other, or at least one of the first to third insulating layers 160a to 160c may include a material different from those of the others. The first to third insulating layers 160a to 160c may include a dielectric material of, for example, an oxide material or a nitride material, and may electrically isolate devices from one another in each layer. In addition, an air gap (not shown) may be formed instead of the second insulating layer 160b. When the air gap is formed, an insulating liner (not shown) having a predetermined thickness may be formed between the air gap and the memory cells 140.

In general, in a variable resistance memory device using the chalcogenide material as a selection device, the chalcogenide material has a low crystallization temperature so that general manufacturing processes for memory devices may not be effectively performed making it difficult to manufacture a memory device having a three-dimensional (3D) cross-point stack structure. Also, since the chalcogenide material has a relatively large off-current, the number of memory cells that are operated at once is reduced and their durability is undesirable. However, the variable resistance memory device 100 according to exemplary embodiments may include the selection device layer 143 including a chalcogenide switching material having a composition according to any of the chemical formulae 1 to 5, and the chalcogenide switching material may exhibit stabilized switching characteristics, low off-current, excellent thermal stability, and excellent durability. Therefore, the variable resistance memory device 100 may have a 3D cross-point stack structure of excellent reliability.

Figure 4:
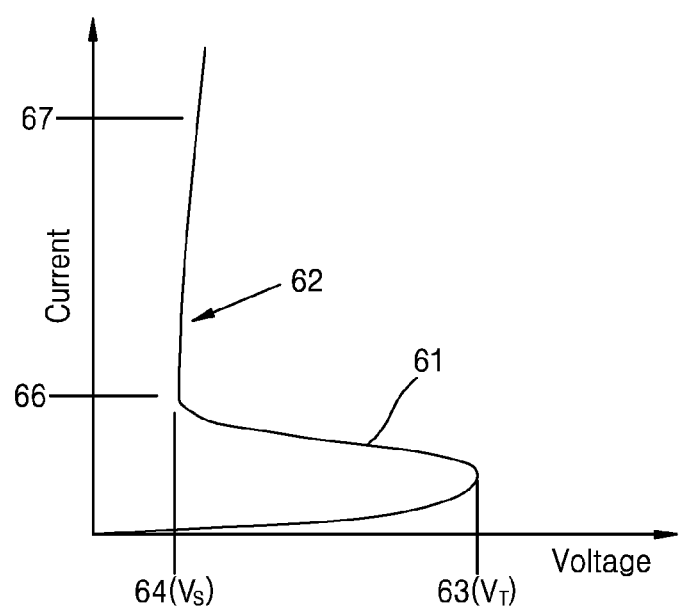
FIG. 4 is a graph schematically showing a voltage-current curve of a selection device layer having an Ovonic threshold switching property.

FIG. 4 is a graph schematically showing a voltage-current curve of a selection device layer having an Ovonic threshold switching characteristic.

As shown in FIG. 4, a first curve 61 denotes a voltage-current relationship in a state where an electric current does not flow through the selection device layer 143 (see FIG. 3).

Here, the selection device layer 143 may function as a switching device having a threshold voltage $V_T$ of a first voltage level 63. When a voltage gradually increases from a state where the voltage and the current are 0, the electric current may rarely flow on the selection device layer 143 until the voltage reaches the threshold voltage $V_T$, that is, the first voltage level 63. However, once the voltage exceeds the threshold voltage $V_T$, the electric current flowing on the selection device layer 143 may greatly increase, and the voltage applied to the selection device layer 143 may decrease to a saturated voltage Vs (that is, a second voltage level 64).

A second curve 62 denotes a voltage-current relationship in a state where the electric current flows in the selection device layer 143. When the electric current flowing in the selection device layer 143 is greater than a first current level 66, a voltage applied to the selection device layer 143 may be slightly increased greater than the second voltage level 64. For example, while the electric current flowing in the selection device layer 143 increases from the first current level 66 to a second current level 67, the voltage applied to the selection device layer 143 may be slightly increased from the second voltage level 64. That is, once the electric current flows through the selection device layer 143, the voltage applied to the selection device layer 143 may be mainly maintained at the saturated voltage Vs. If the electric current decreases to a retention current level (e.g., the first current level 66) or less, the selection device layer 143 is switched to a resistor state so as to effectively block the electric current until the voltage increases to the threshold voltage $V_T$.

As shown in FIG. 4, when the memory device is in a turn-off state (e.g., a state where a predetermined voltage less than the threshold voltage $V_T$ is applied), a small amount of electric current may flow. As the leakage current in the off-state becomes greater, the number of memory cells that may be operated at once is reduced and stabilized switching characteristics may not be obtained, and thus, it may be difficult to implement the variable resistance memory device having the 3D cross-point structure. However, the selection device layer 143 according to exemplary embodiments includes the chalcogenide switching material having the composition according to any of the chemical formulae 1 to 5. Therefore, the selection device layer 143 may have stabilized switching characteristics and low off-current, and the variable resistance memory device 100 may have the 3D cross-point stack structure having excellent reliability.

Hereinafter, memory devices including the chalcogenide switching material according to exemplary embodiments will be described in detail with reference to FIGS. 5, and 6A to 6C.

Figure 5:
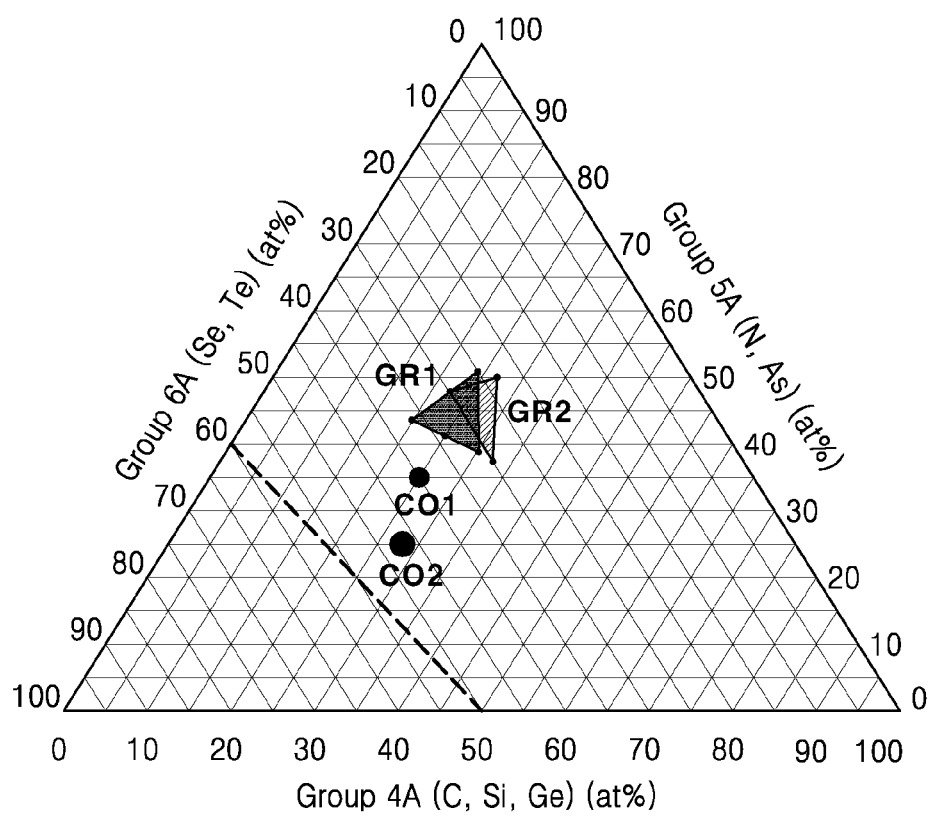
FIG. 5 is a ternary phase diagram showing a composition range of a chalcogenide switching material according to exemplary embodiments.

FIG. 5 is a ternary phase diagram showing a composition range of a chalcogenide switching material according to exemplary embodiments.

Figure 6A:
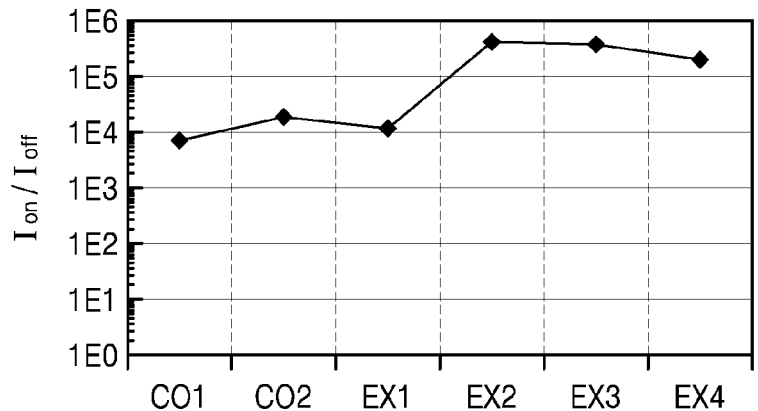
FIGS. 6A to 6C are graphs showing characteristics of memory devices including a chalcogenide switching material according to exemplary embodiments.
Figure 6B:
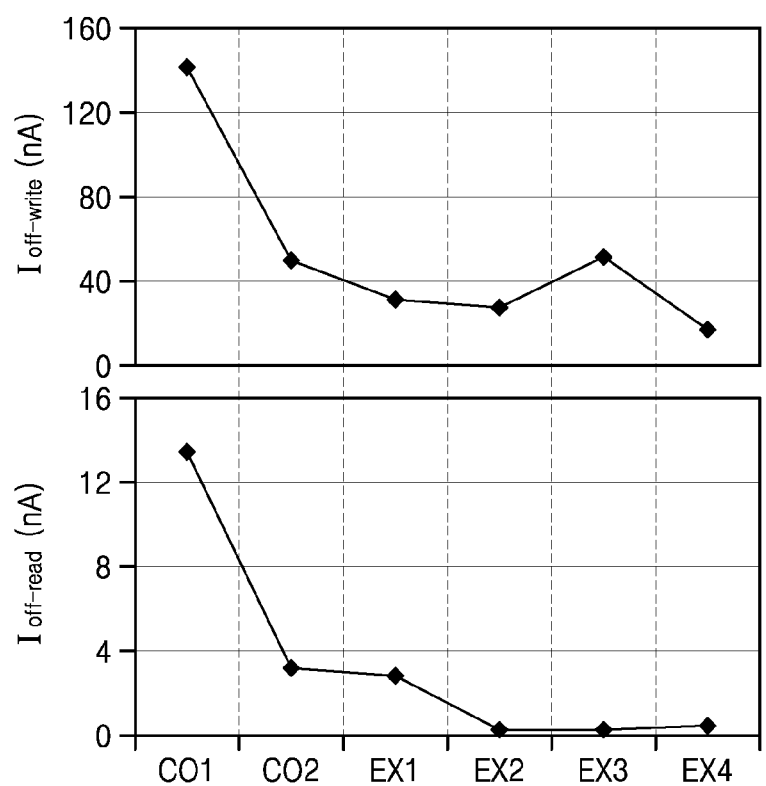
Figure 6C:
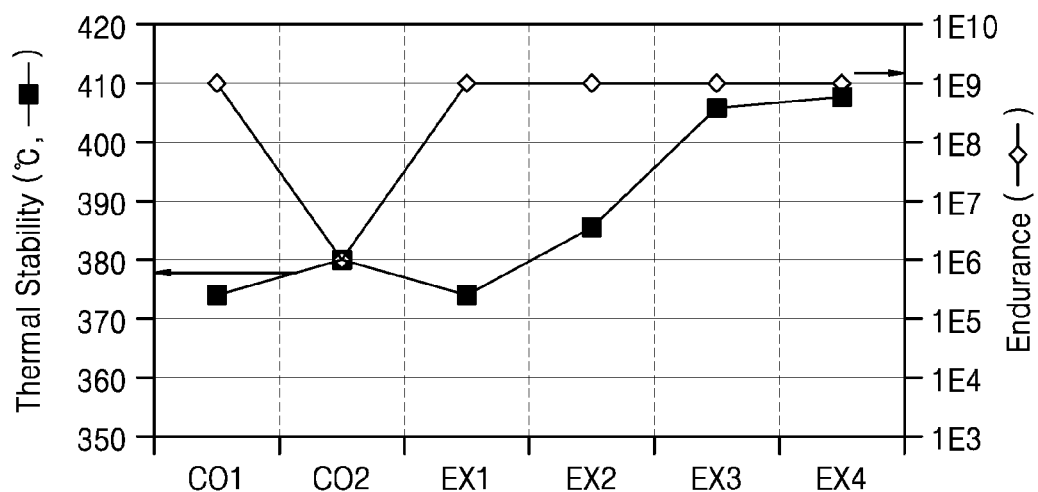

FIGS. 6A to 6C are graphs showing characteristics of memory devices including the chalcogenide switching material according to exemplary embodiments.

As shown in FIG. 5, the chalcogenide switching material according to exemplary embodiments may have a composition range (group I (GR1)) according to the chemical formulae 1 and 2 and a composition range (group II (GR2)) according to the chemical formulae 3 to 5 above.

For example, the group I GR1 may include Ge, Si, As, Te, N, and selectively C, and may include As and Te so that a ratio of As with respect to an entire atomic amount of As and Te is about 0.45 to about 0.6 and N may be contained in an amount of about 8% to about 20%.

For example, the group II GR2 includes Ge, Si, As, Te, Se, and selectively at least one of N and C, and may have a composition in which a part of Te (e.g., greater than 0% and equal to or less than 30%) is substituted by Se.

In FIGS. 6A to 6C, on-current characteristics of the group I GR1 and the group II GR2 according to exemplary embodiments versus the off-current (FIG. 6A), off-currents in writing and reading operations (FIG. 6B), and thermal stability and durability (FIG. 6C) are shown. In FIG. 6C, the thermal stability denotes a crystallization temperature that is obtained from a result of measuring a differential scanning calorimetry (DSC) under a condition of about 50° C./min.

An experimental example 1 (EX1) of the group I GR1 is a chalcogenide switching material having a composition of $[Ge_{0.08}Si_{0.17}As_{0.422}Te_{0.328}]_{0.90}[N]_{0.10}$, an experimental example 2 (EX2) of the group I GR1 is a chalcogenide switching material having a composition of $[Ge_{0.08}Si_{0.17}As_{0.422}\ Te_{0.328}]_{0.82}[N]_{0.18}$, an experimental example 3 (EX3) of the group II GR2 is a chalcogenide switching material having a composition of $[Ge_{0.08}Si_{0.17}As_{0.422}Te_{0.328}]_{0.86}[N]_{0.10}[C]_{0.04}$, and an experimental example 4 (EX4) of the group II GR2 is a chalcogenide switching material having a composition of $[Ge_{0.08}Si_{0.17}As_{0.422}\ Te_{0.248}Se_{0.08}]_{0.82}[N]_{0.18}$.

In addition, to be compared with the group I (GR1) and the group II (GR2) according to exemplary embodiments, characteristics of chalcogenide switching materials according to a comparative example 1 (CO1) and a comparative example 2 (CO2) were measured and shown in FIGS. 6A to 6C. The comparative example 1 (CO1) is a chalcogenide switching material having a composition of $Ge_8Si_{17}As_{35}Te_{40}$, and the comparative example 2 (CO2) is a chalcogenide switching material having a composition of $Ge_XSi_YAs_ZTe_USe_WS_V$ (where X is 17 to 19, Y is 7 to 10, Z is 25 to 27, U is 28 to 30, W is 28 to 30, and V is 5 to 6). In addition, the compositions of the chalcogenide switching materials of the comparative examples 1 and 2, CO1 and CO2, are shown in the phase diagram of FIG. 5.

As shown in FIG. 6A, the experimental examples 1 to 4, EX1, EX2, EX3, and EX4, show relatively high on-current versus off-current ($I_{on}/I_{off}$) when comparing with the comparative examples 1 and 2, CO1 and CO2. For example, the experimental examples 1 to 4, EX1, EX2, EX3, and EX4, respectively show $I_{on}/I_{off}$ values of 1.2E4, 4.2E5, 3.9E5, and 2.1E5, but the comparative examples 1 and 2, CO1 and CO2, show $I_{on}/I_{off}$ values of about 7.8E3 and 1.8E4.

As shown in FIG. 6B, the experimental examples 1 to 4, EX1, EX2, EX3, and EX4, show much lower write off-current $I_{off\text{-}write}$ and read off-current $I_{off\text{-}read}$ when comparing with the comparative examples 1 and 2, CO1 and CO2. For example, the experimental example 4, EX4, has a write off-current $I_{off\text{-}write}$ of 18 nA and a read off-current $I_{off\text{-}read}$ of 0.54 nA, which are much lower than a write off-current $I_{off\text{-}write}$ of 142 nA and a read off-current $I_{off\text{-}read}$ of 13.5 nA of the comparative example 1, CO1.

As shown in FIG. 6C, the experimental examples 1 to 4, EX1, EX2, EX3, and EX4, all show excellent thermal stability (or crystallization temperatures) and excellent endurance.

As described above, the chalcogenide switching material according to exemplary embodiments includes As and Te, so that a ratio of As with respect to the total atomic amount of As and Te is about 0.45 to 0.6, and further includes N in an amount of about 8% to about 20%. The chalcogenide switching material according to exemplary embodiments may selectively include C in an amount of about 1% to about 15%. In addition, the chalcogenide switching material according to exemplary embodiments may have a composition, in which a part of Te (e.g., greater than 0% and equal to or less than 30%) is substituted by Se. As identified from characteristics of the experimental examples 1 to 4, EX1, EX2, EX3, and EX4, the chalcogenide material according to exemplary embodiments may have greatly reduced write off-current $I_{off\text{-}write}$ and read off-current $I_{off\text{-}read}$, and accordingly, may have high on-current versus off-current ($I_{on}/I_{off}$). In addition, the chalcogenide material may have excellent thermal stability and excellent endurance.

FIGS. 7 to 10 are cross-sectional views of a variable resistance memory device according to exemplary embodiments, and correspond to the cross-section shown in FIG. 3.

Figure 7:
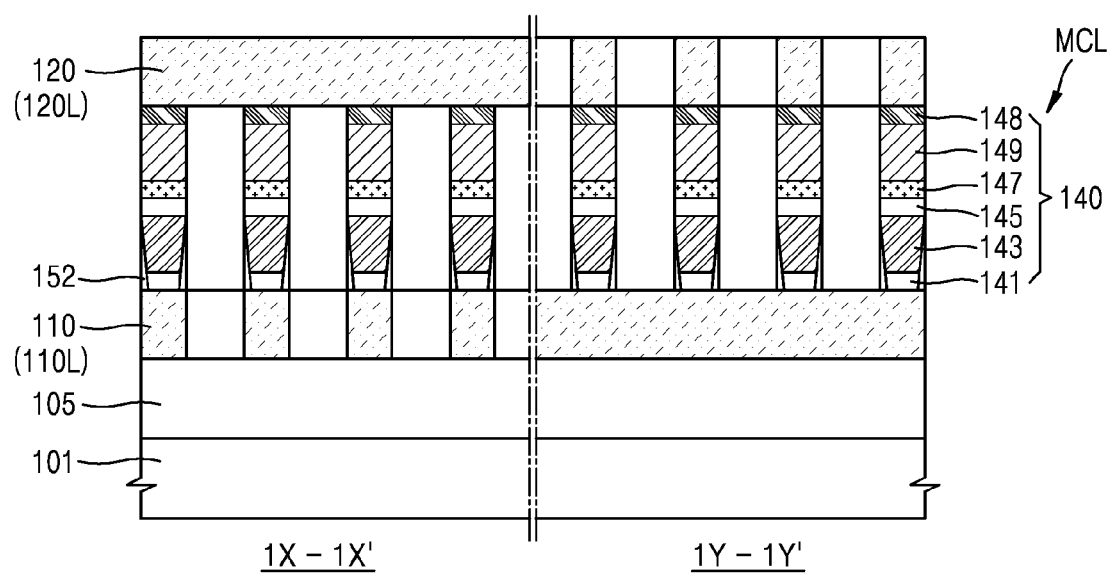
FIGS. 7 to 10 are cross-sectional views of variable resistance memory devices according to exemplary embodiments.

FIG. 7 is a cross-sectional view of a variable resistance memory device 100a according to an exemplary embodiment. Descriptions that are provided above with reference to FIGS. 2 and 3 may be omitted.

As shown in FIG. 7, the variable resistance memory device 100a according to an exemplary embodiment may be different from the variable resistance memory device 100 of FIG. 3, in that the lower electrode layer 141 and the selection device layer 143 are formed as damascene structures. In detail, in the variable resistance memory device 100a according to an exemplary embodiment, the lower electrode layer 141 and the selection device layer 143 are formed by a damascene process, and the intermediate electrode layer 145, the heating electrode layer 147, the variable resistance layer 149, and the upper electrode layer 148 may be formed by an etching process. Accordingly, the lower electrode layer 141 and the selection device layer 143 may have a structure in which the width is reduced in the downward direction.

Also, in the variable resistance memory device 100a according to an exemplary embodiment, lower spacers 152 may be formed on side surfaces of the lower electrode layer 141 and the selection device layer 143. In the variable resistance memory device 100a according to an exemplary embodiment, when the lower electrode layer 141 and the selection device layer 143 are formed by the damascene process, the lower spacers 152 are formed on side surfaces in trenches in advance, and after that, the lower electrode layer 141 and the selection device layer 143 may be formed. Accordingly, the variable resistance memory device 100a according to an exemplary embodiment may include the lower spacers 152 on the side surfaces of the lower electrode layer 141 and the selection device layer 143. The lower spacers 152 may be omitted.

Figure 8:
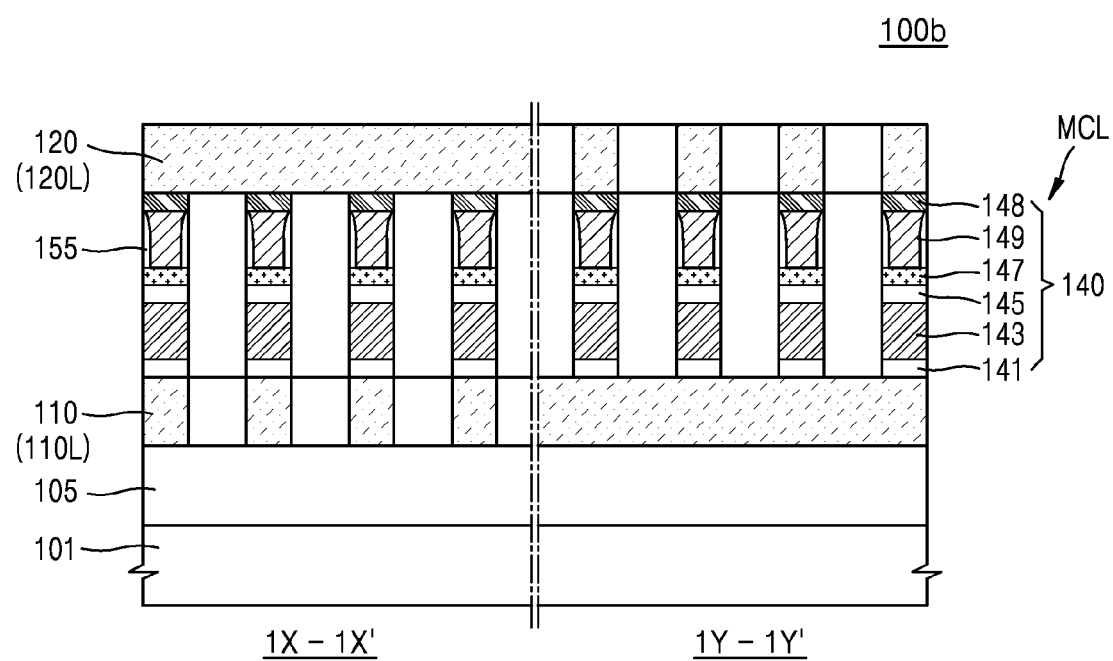

FIG. 8 is a cross-sectional view of a variable resistance memory device 100b according to an exemplary embodiment. Descriptions that are provided above with reference to FIGS. 2 and 3 may be omitted.

As shown in FIG. 8, the variable resistance memory device 100b according to an exemplary embodiment may be different from the variable resistance memory device 100 of FIG. 3, in that the variable resistance layer 149 is formed as a damascene structure. In detail, in the variable resistance memory device 100b of an exemplary embodiment, the lower electrode layer 141, the selection device layer 143, the intermediate electrode layer 145, the heating electrode layer 147, and the upper electrode layer 148 are formed by an etching method, and the variable resistance layer 149 may be formed by a damascene process. Also, in the variable resistance memory device 100b according to an exemplary embodiment, upper spacers 155 may be formed on side surfaces of the variable resistance layer 149. The upper spacer 155 may be formed in the same manner as that of the lower spacer 152 in the variable resistance memory device 100a of FIG. 7. For example, trenches are formed on an insulating layer (not shown), the upper spacers 155 are formed on internal side surfaces of the trenches, and a material for the variable resistance layer 149 fills remaining spaces in the trenches. However, the upper spacer 155 may be omitted.

Figure 9:
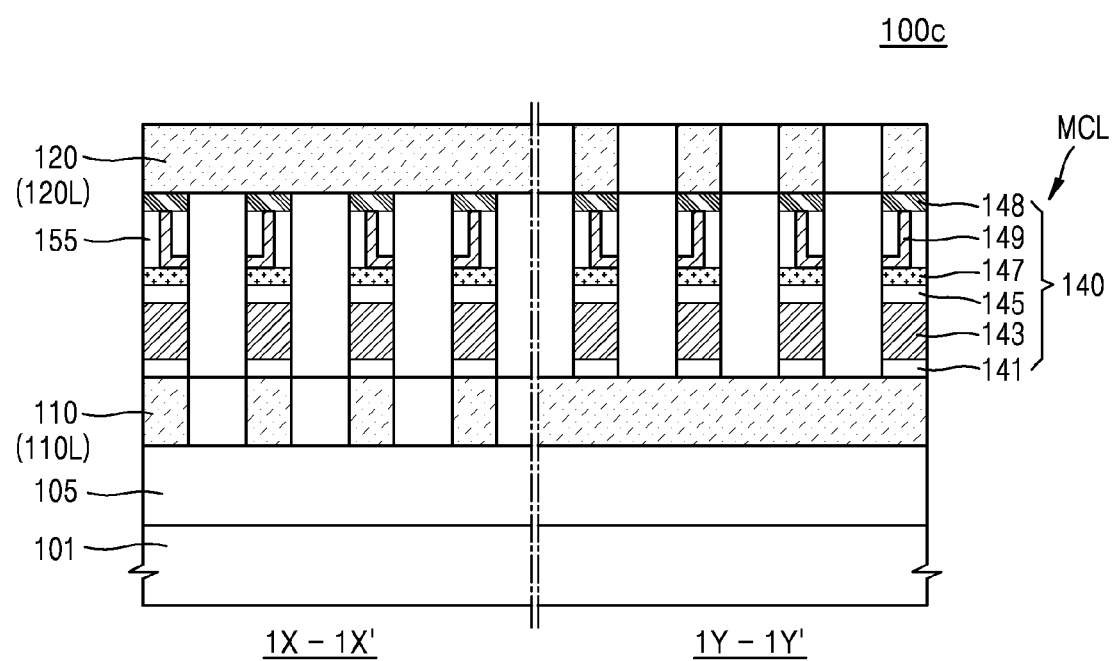

FIG. 9 is a cross-sectional view of a variable resistance memory device 100c according to an exemplary embodiment. Descriptions that are provided above with reference to FIGS. 2 and 3 may be omitted.

As shown in FIG. 9, the variable resistance memory device 100c according to an exemplary embodiment is different from the variable resistance memory device 100b of FIG. 8, in that the variable resistance layer 149 is formed as a damascene structure to have 'L'-shaped structure. In detail, in the variable resistance memory device 100c according to an exemplary embodiment, the lower electrode layer 141, the selection device layer 143, the intermediate electrode layer 145, the heating electrode layer 147, and the upper electrode layer 148 are formed by an etching method, and the variable resistance layer 149 may be formed by a damascene process.

In addition, in the variable resistance memory device 100c according to an exemplary embodiment, the upper spacers 155 may be formed on the side surfaces of the variable resistance layer 149. However, since the variable resistance layer 149 is formed to have an 'L'-shaped structure, the upper spacers 155 may be formed in an asymmetric structure. The variable resistance layer 149 having the 'L'-shaped structure may be formed by the damascene process as follows. An insulating layer is formed on the heating electrode layer 147, and trenches are formed in the insulating layer. The trenches are formed wide to overlap adjacent memory cells 140. Next, a first material layer that will configure the variable resistance layer is formed conformally in the trenches and on the insulating layer, and after that, a second material layer that will form the upper spacers is formed on the first material layer. Then, a chemical mechanical polishing (CMP) process is performed to planarize and expose an upper surface of the insulating layer. After the planarization, a mask pattern aligned with the memory cells 140 is formed, and the first material layer and the second material layer are etched by using the mask pattern to form the variable resistance layer 149 of the 'L'-shape and the upper spacers 155.

Figure 10:
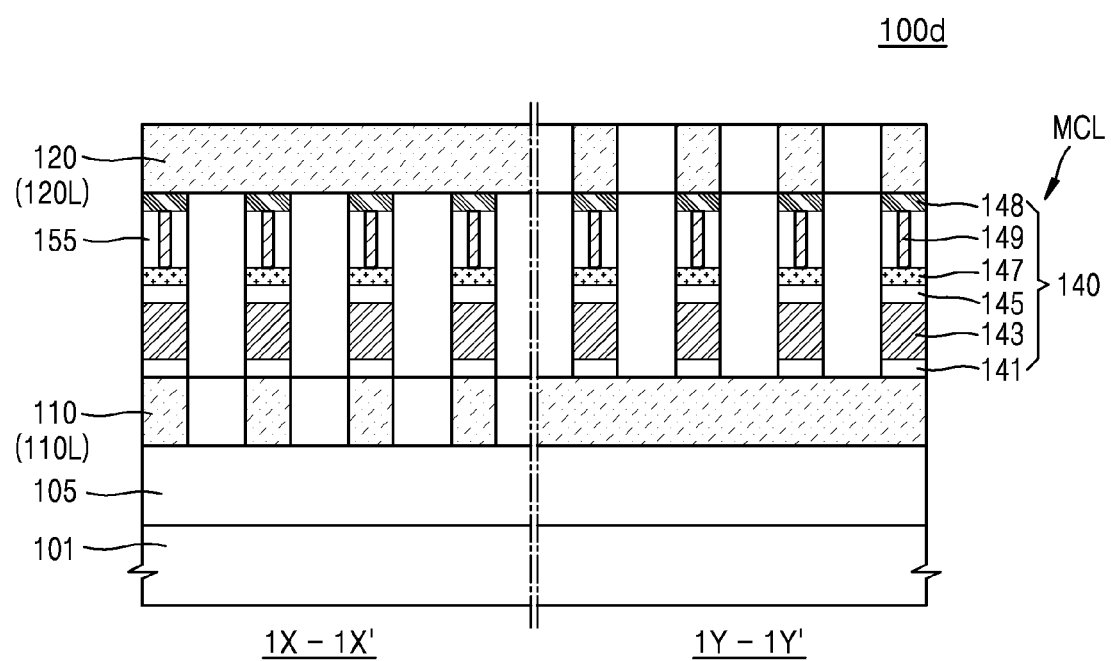

FIG. 10 is a cross-sectional view of a variable resistance memory device 100d according to an exemplary embodiment. Descriptions that are provided above with reference to FIGS. 2 and 3 may be omitted.

As shown in FIG. 10, the variable resistance memory device 100d according to an exemplary embodiment is different from the variable resistance memory device 100c of FIG. 9 in that the variable resistance layer 149 is formed as a dash structure. The variable resistance layer 149 of the dash structure may be formed in a similar manner to that forming the variable resistance layer 149 in the 'L'-shaped structure. For example, a first material layer for forming the variable resistance layer 149 is formed conformally in the trenches and on the insulating layer, and after that, the first material layer remains only on side walls of the trenches through an anisotropic etching. After that, a second material layer is formed to cover the first material layer. Then, a planarization is performed through a CMP process to expose an upper surface of the insulating layer. After the planarization process, a mask pattern aligned with the memory cells 140 is formed, and the second material layer is etched by using the mask pattern to form the variable resistance layer 149 of the dash structure and the upper spacers 155.

Figure 11:
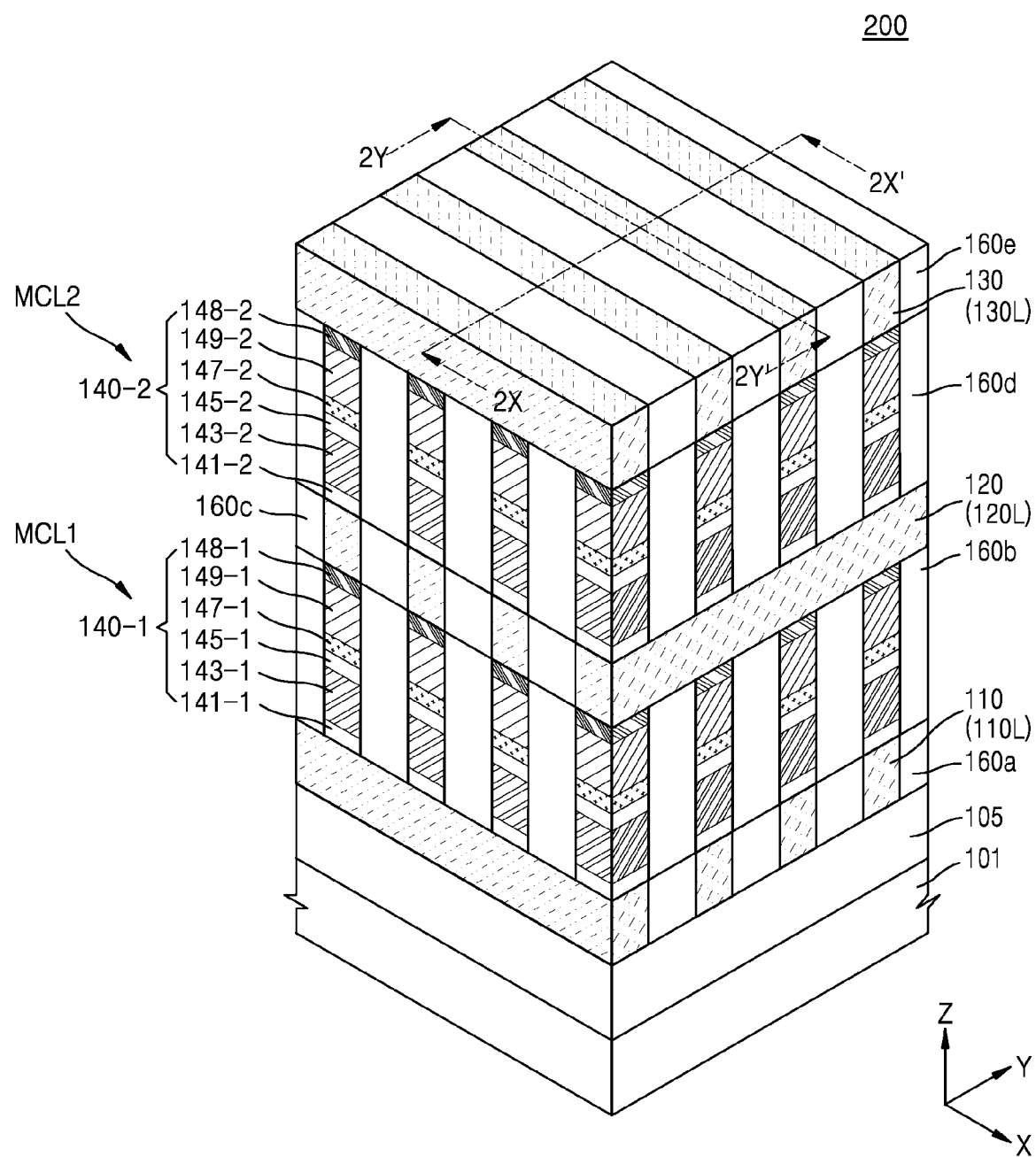
FIG. 11 is a perspective view of a variable resistance memory device according to an exemplary embodiment.
Figure 12:
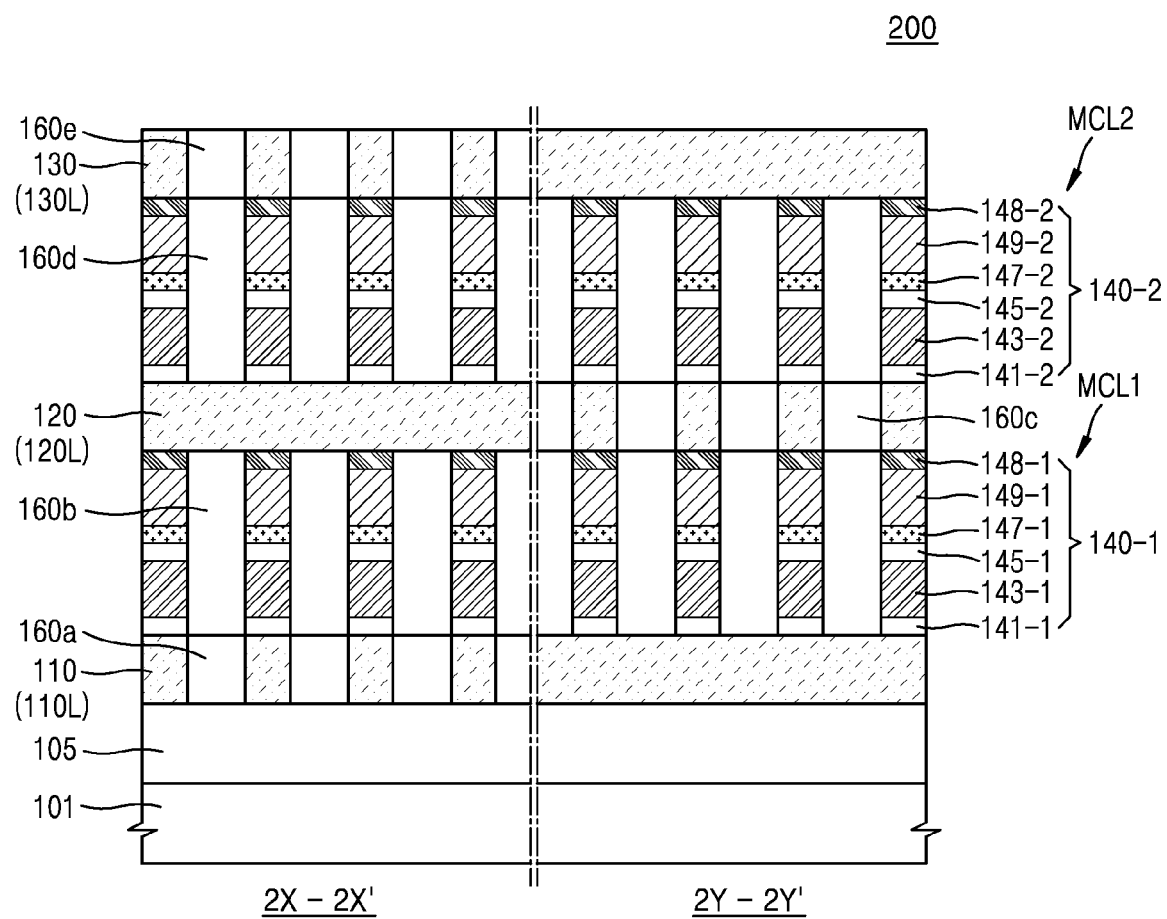
FIG. 12 is a cross-sectional view of the variable resistance memory device taken along a line 2X-2X' and 2Y-2Y' of FIG. 11.

FIG. 11 is a perspective view of a variable resistance memory device 200 according to an exemplary embodiment, and FIG. 12 is a cross-sectional view of the variable resistance memory device taken along a line 2X-2X' and 2Y-2Y' of FIG. 11. Descriptions that are provided above with reference to FIGS. 2 and 3 may be omitted.

As shown in FIGS. 11 and 12, the variable resistance memory device 200 may include a first electrode line layer 110L, a second electrode line layer 120L, a third electrode line layer 130L, a first memory cell layer MCL1, and a second memory cell layer MCL2 on the substrate 101.

As shown in the drawings, an interlayer insulating layer 105 may be arranged on the substrate 101. The first electrode line layer 110L may include a plurality of first electrode lines 110 extending in a first direction (X direction) in parallel with one another. The second electrode line layer 120L may include a plurality of second electrode lines 120 extending in a second direction (Y direction) that is perpendicular to the first direction in parallel with one another. In addition, the third electrode line layer 130L may include a plurality of third electrode lines 130 extending in the first direction (X direction) in parallel with one another. In addition, the third electrode lines 130 may be identical with the first electrode lines 110 in the extending direction or arrangement structure, except for locations thereof in a third direction (Z direction). Therefore, the third lines 130 may be referred to as first electrode lines in the third electrode line layer 130L.

In view of driving the variable resistance memory device 200, the first electrode lines 110 and the third electrode lines 130 may correspond to word lines, and the second electrode lines 120 may correspond to bit lines. Otherwise, the first electrode lines 110 and the third electrode lines 130 may correspond to the bit lines, and the second electrode lines 120 may correspond to the word lines. When the first electrode lines 110 and the third electrode lines 130 correspond to the word lines, the first electrode lines 110 may correspond to lower word lines and the third electrode lines 130 may correspond to upper word lines, and the second electrode lines 120 may correspond to common bit lines shared by the lower and upper word lines.

The first electrode lines 110, the second electrode lines 120, and the third electrode lines 130 may each include metal, conductive metal nitride, conductive metal oxide, or a combination thereof. In addition, the first electrode lines 110, the second electrode lines 120, and the third electrode lines 130 may each include a metal layer, and a conductive barrier layer at least partially covering the metal layer.

The first memory cell layer MCL1 may include a plurality of first memory cells 140-1 spaced apart from one another in the first direction and the second direction. The second memory cell layer MCL2 may include a plurality of second memory cells 140-2 spaced apart from one another in the first direction and the second direction. As shown in the drawings, the first electrode lines 110 and the second electrode lines 120 cross each other, and the second electrode lines 120 and the third electrode lines 130 may cross each other. The first memory cells 140-1 may be arranged on portions where the first electrode lines 110 and the second electrode lines 120 cross each other between the first electrode line layer 110L and the second electrode line layer 120L. The second memory cells 140-2 may be arranged on portions where the second electrode lines 120 and the third electrode lines 130 cross each other between the second electrode line layer 120L and the third electrode line layer 130L.

The first memory cells 140-1 and the second memory cells 140-2 may respectively include lower electrode layers 141-1 and 141-2, selection device layers 143-1 and 143-2, intermediate electrode layers 145-1 and 145-2, heating electrode layers 147-1 and 147-2, variable resistance layers 149-1 and 149-2, and upper electrode layers 148-1 and 148-2. The first memory cells 140-1 and the second memory cells 140-2 may have substantially the same structures.

A first insulating layer 160a is arranged among the first electrode lines 110, and a second insulating layer 160b may be arranged among the first memory cells 140-1 of the first memory cells MCL1. In addition, a third insulating layer 160c is arranged among the second electrode lines 120, a fourth insulating layer 160d may be arranged among the second memory cells 140-2 of the second memory cell layer MCL2, and a fifth insulating layer 160e may be arranged among the third electrode lines 130. The first to fifth insulating layers 160a to 160e may include the same material, or at least one of which may include a different material from the others. The first to fifth insulating layers 160a to 160e may include a dielectric material of oxide or nitride, and may electrically isolate devices from one another in each layer. In addition, air gaps (not shown) may be formed instead of at least one of the second insulating layer 160b and the fourth insulating layer 160d. When the air gaps are formed, an insulating liner (not shown) having a predetermined thickness may be formed between the air gaps and the first memory cells 140-1, and/or between the air gaps and the second memory cells 140-2.

The variable resistance memory device 200 according to an exemplary embodiment may have a structure, in which the variable resistance memory device 100 having the structure shown in FIGS. 2 and 3 is repeatedly stacked. However, the variable resistance memory device 200 is not limited thereto, for example, the variable resistance memory device 200 according to an exemplary embodiment may have a structure, in which the variable resistance memory devices 100a to 100d of various structures exemplarily illustrated in FIGS. 7 to 10 are stacked.

Figure 13:
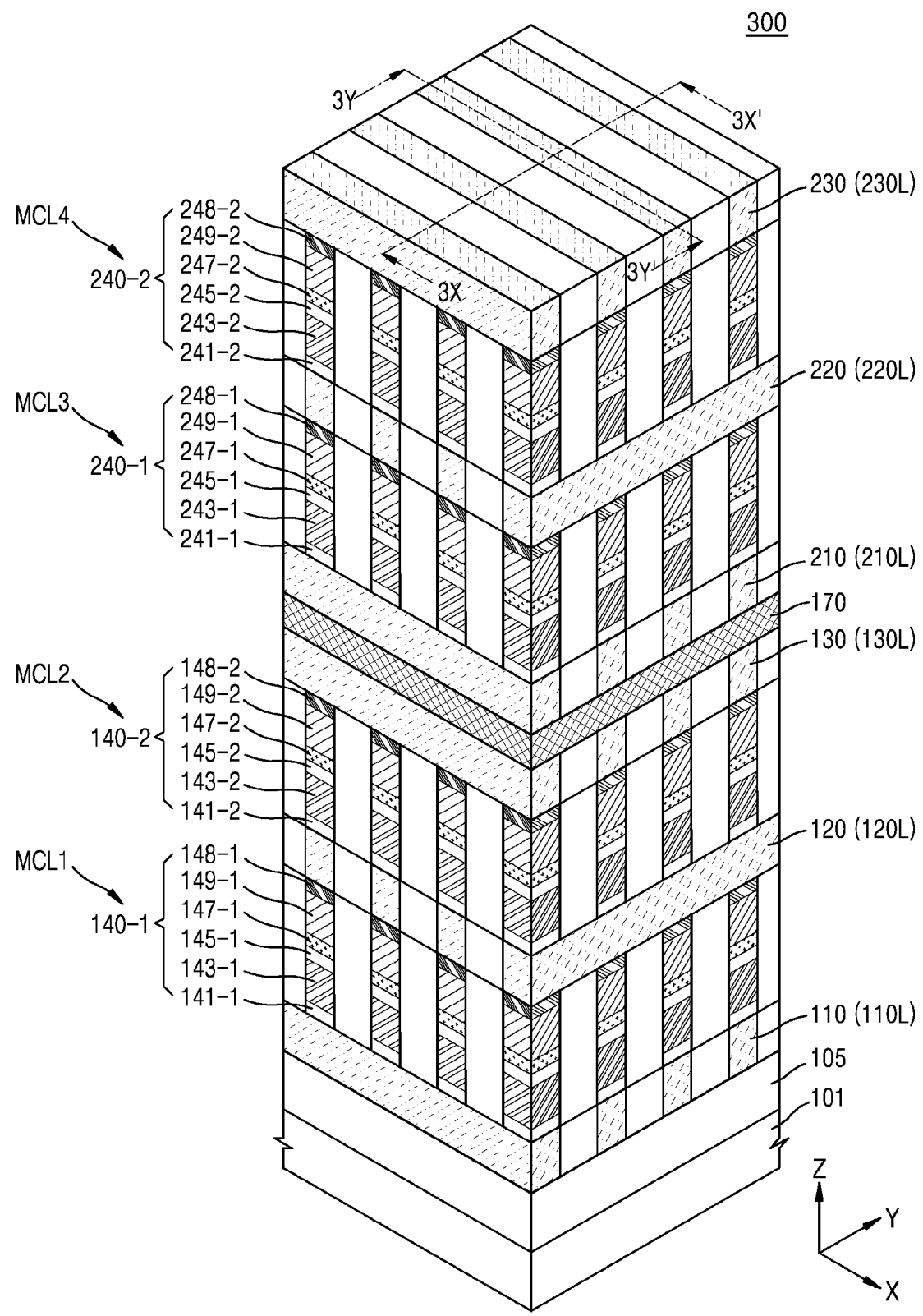
FIG. 13 is a perspective view of a variable resistance memory device according to an exemplary embodiment.
Figure 14:
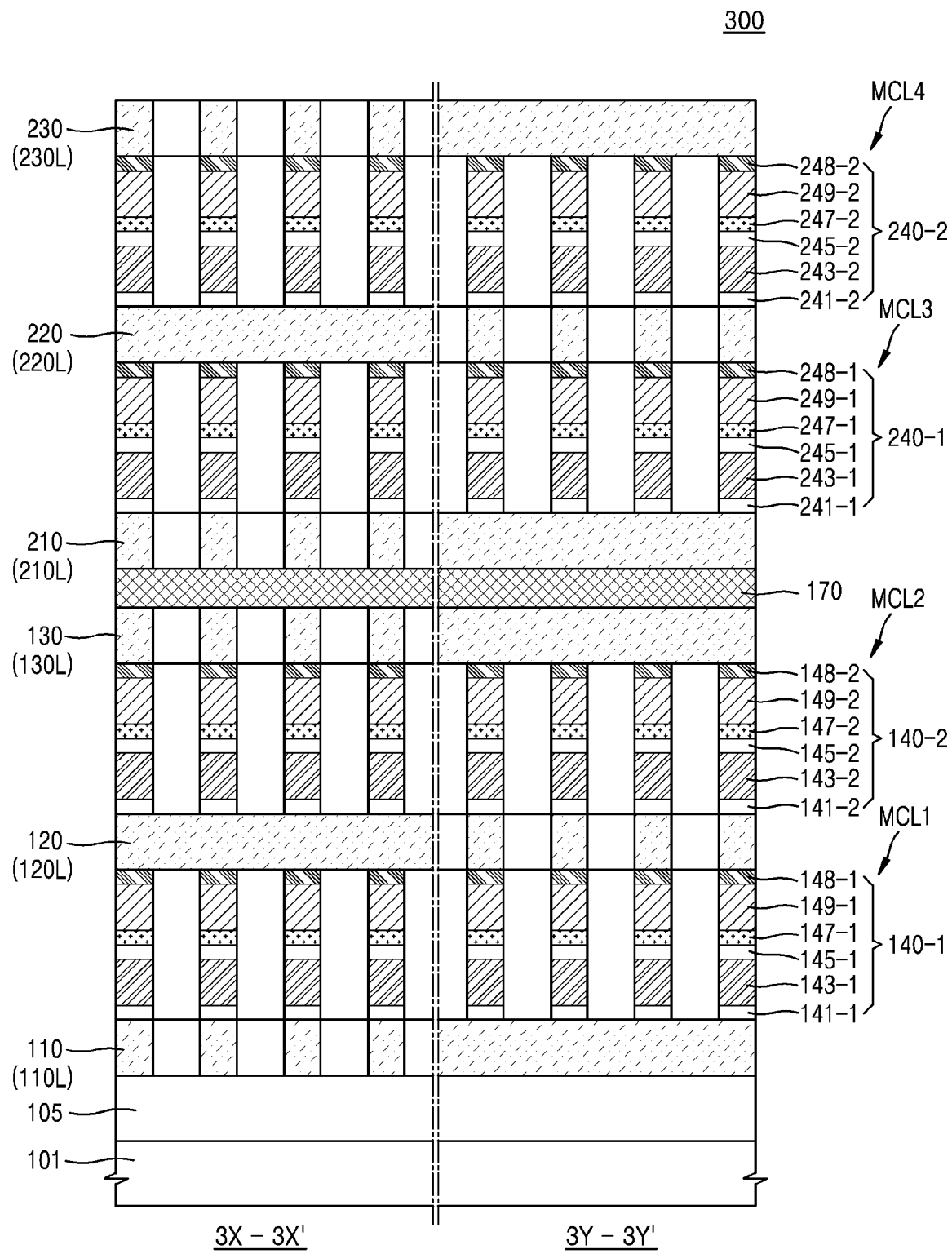
FIG. 14 is a cross-sectional view taken alone lines 3X-3X' and 3Y-3Y' of FIG. 13.

FIG. 13 is a perspective view of a variable resistance memory device 300, and FIG. 14 is a cross-sectional view of the variable resistance memory device 300 taken along a line 3X-3X' and 3Y-3Y' of FIG. 13. Descriptions that are provided above with reference to FIGS. 2, 3, 11, and 12 may be omitted.

As shown in FIGS. 13 and 14, the variable resistance memory device 300 according to an exemplary embodiment may have a four-layered structure including four memory cell layers MCL1, MCL2, MCL3, and MCL4. In detail, the first memory cell layer MCL1 may be arranged between the first electrode line layer 110L and the second electrode line layer 120L, and the second memory cell layer MCL2 may be arranged between the second electrode line layer 120L and the third electrode line layer 130L. A second interlayer insulating layer 170 may be formed on the third electrode line layer 130L, and a first upper electrode line layer 210L, a second upper electrode line layer 220L, and a third upper electrode line layer 230L may be arranged on the second interlayer insulating layer 170. The first upper electrode line layer 210L includes first upper electrode lines 210 having the same structure as that of the first electrode lines 110, the second upper electrode line layer 220L includes second upper electrode lines 220 having the same structure as that of the second electrode lines 120, and the third upper electrode line layer 230L includes third upper electrode lines 230 having the same structure as that of the third electrode lines 130 or the first electrode lines 110. The first upper memory cell layer MCL3 is arranged between the first upper electrode line layer 210L and the second upper electrode line layer 220L, and the second upper memory cell layer MCL4 may be arranged between the second upper electrode line layer 220L and the third upper electrode line layer 230L.

The first to third electrode line layers 110L to 130L and the first and second memory cells MCL1 and MCL2 are the same as those illustrated in FIGS. 2, 3, 11, and 12. In addition, the first to third upper electrode line layers 210L to 230L, and the first and second upper memory cell layers MCL3 and MCL4 may be substantially the same as the first to third electrode line layers 110L to 130L, and the first and second memory cell layers MCL1 and MCL2, except for being arranged on the second interlayer insulating layer 170 instead of the first interlayer insulating layer 105.

The variable resistance memory device 300 according to an exemplary embodiment may have a structure, in which the variable resistance memory device 100 having the structure shown in FIGS. 2 and 3, is repeatedly stacked, but is not limited thereto. For example, the variable resistance memory device 300 according to an exemplary embodiment may have a structure, in which the variable resistance memory devices 100a to 100d having various structures exemplarily shown in FIGS. 7 to 10 are stacked.

Figure 15:
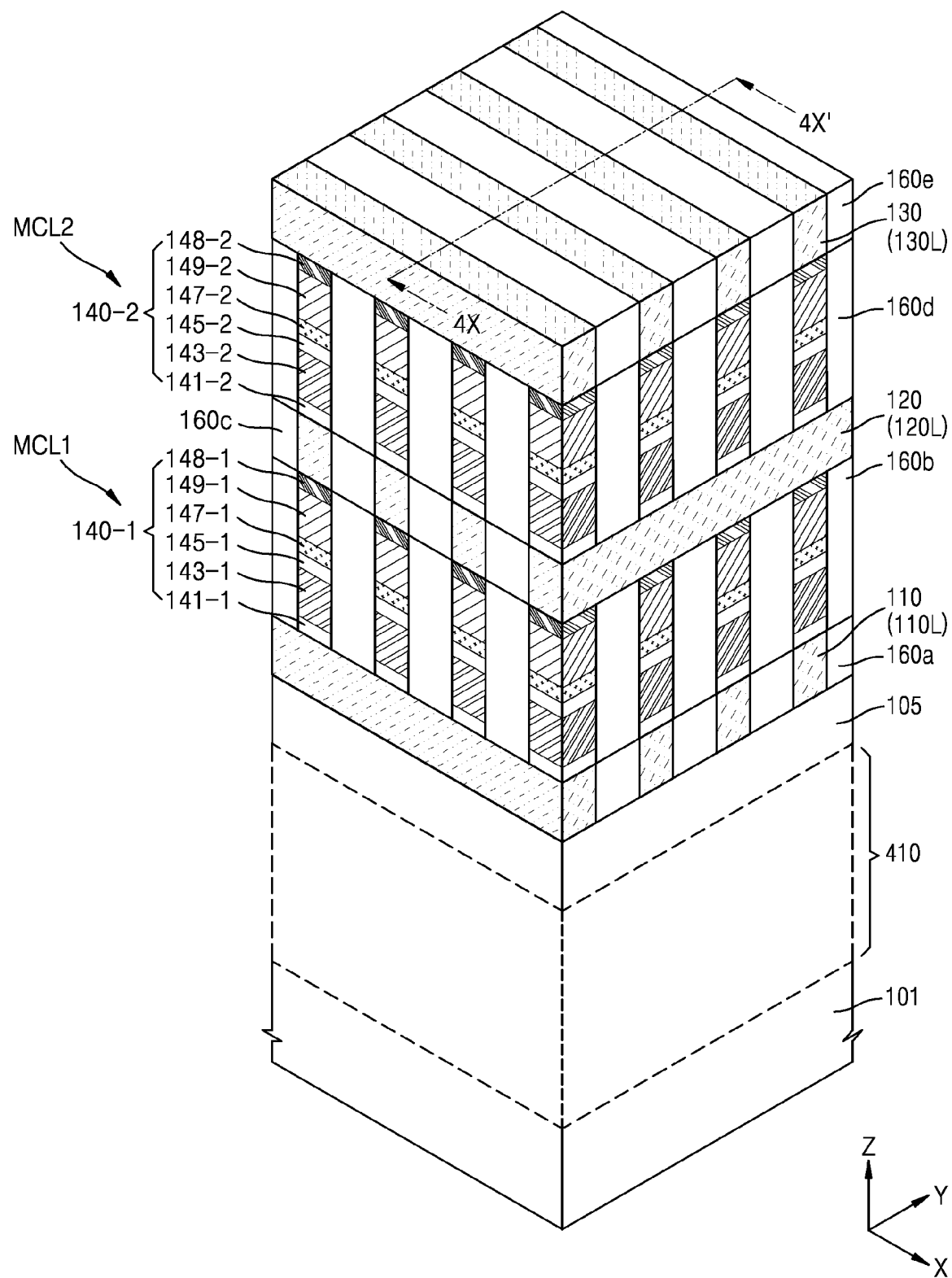
FIG. 15 is a perspective view of a variable resistance memory device according to an exemplary embodiment.
Figure 16:
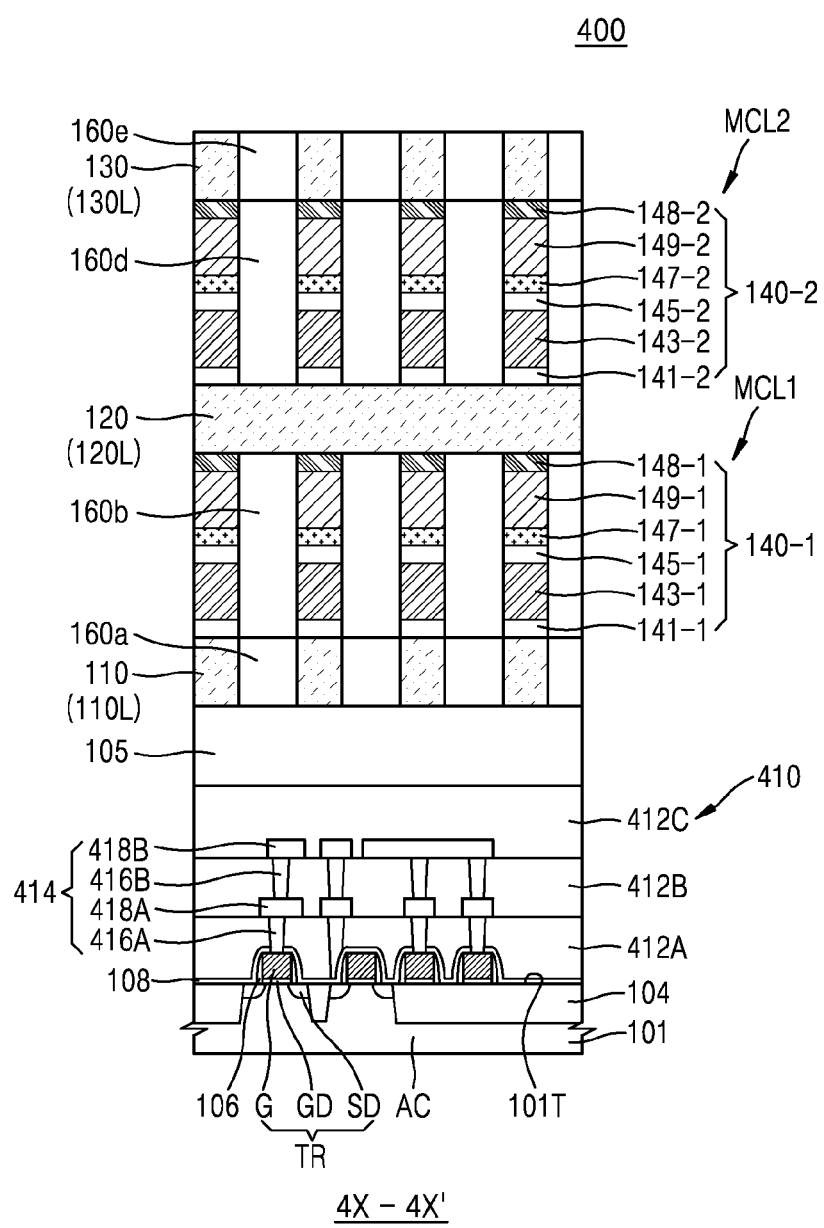
FIG. 16 is a cross-sectional view taken along a line 4X-4X' of FIG. 15.

FIG. 15 is a perspective view of a variable resistance memory device 400 according to an exemplary embodiment, and FIG. 16 is a cross-sectional view of the variable resistance memory device 400 taken along a line 4X-4X' of FIG. 15. Descriptions that are provided above with reference to FIGS. 2, 3, 11, and 12 may be omitted.

As shown in FIGS. 15 and 16, the variable resistance memory device 400 may include a driving circuit region 410 formed at a first level above the substrate 101, and the first memory cell layer MCL1 and the second memory cell layer MCL2 formed at a second level above the substrate 101.

Here, 'level' denotes a height along a perpendicular direction from the substrate 100 (Z direction in FIGS. 15 and 16). Above the substrate 101, the first level is closer to the substrate 101 than the second level is.

The driving circuit region 410 may be a region where peripheral circuits or driving circuits for driving memory cells in the first memory cell layer MCL1 and the second memory cell layer MCL2 are arranged. For example, the peripheral circuits arranged on the driving circuit region 410 may be circuits capable of processing data input to/output from the first memory cell layer MCL1 and the second memory cell layer MCL2 at a high speed. For example, the peripheral circuits may include a page buffer, a latch circuit, a cache circuit, a column decoder, a sense amplifier, a data in/out circuit, or a row decoder.

An active area AC for driving circuits may be defined on the substrate 101 by a device isolation layer 104. A plurality of transistors TR forming the driving circuit region 410 may be formed on the active area AC of the substrate 101. Each of the plurality of transistors TR may include a gate G, a gate insulating layer GD, and source/drain regions SD. Opposite side walls of the gate G may be covered by insulating spacers 106, and an etch stop layer 108 may be formed on the gate G and the insulating spacers 106. The etch stop layer 108 may include an insulating material such as silicon nitride or silicon oxynitride.

A plurality of interlayer insulating layers 412A, 412B, and 412C may be sequentially stacked on the etch stop layer 108. The plurality of interlayer insulating layers 412A, 412B, and 412C may each include silicon oxide, silicon nitride, or silicon oxynitride.

The driving circuit region 410 includes multi-layered wiring structures 414 electrically connected to the plurality of transistors TR. The multi-layered wiring structures may be insulated from each other by the plurality of the interlayer insulating layers 412A, 412B, and 412C.

The multi-layered wiring structures 414 may each include a first contact 416A, a first wiring layer 418A, a second contact 416B, and a second wiring layer 418B that are sequentially stacked on the substrate 101 and electrically connected to one another. In exemplary embodiments, the first wiring layer 418A and the second wiring layer 418B may include metal, conductive metal, metal silicide, or a combination thereof. For example, the first wiring layer 418A and the second wiring layer 418B may include a conductive material such as tungsten, molybdenum, titanium, cobalt, tantalum, nickel, tungsten silicide, cobalt silicide, tantalum silicide, or nickel silicide.

In FIG. 16, the multi-layered wiring structure 414 has dual-layered wiring structure including the first wiring layer 418A and the second wiring layer 418B, but one or more exemplary embodiments are not limited to the example of FIG. 16. For example, the multi-layered wiring structure 414 may have three or more wiring layer structures, according to a layout of the driving circuit region 410.

The interlayer insulating layer 105 may be formed on the plurality of interlayer insulating layers 412A, 412B, and 412C. The first and second memory cell layers MCL1 and MCL2 may be arranged on the interlayer insulating layer 105.

Although not shown in the drawings, a wiring structure (not shown) connected between the first and second memory cell layers MCL1 and MCL2 and the driving circuit region 410 may be arranged penetrating through the interlayer insulating layer 105.

According to the variable resistance memory device 400 of exemplary embodiments, since the first and second memory cell layers MCL1 and MCL2 are arranged on the driving circuit region 410, integrity of the variable resistance memory device 400 may be further improved.

Figure 17:
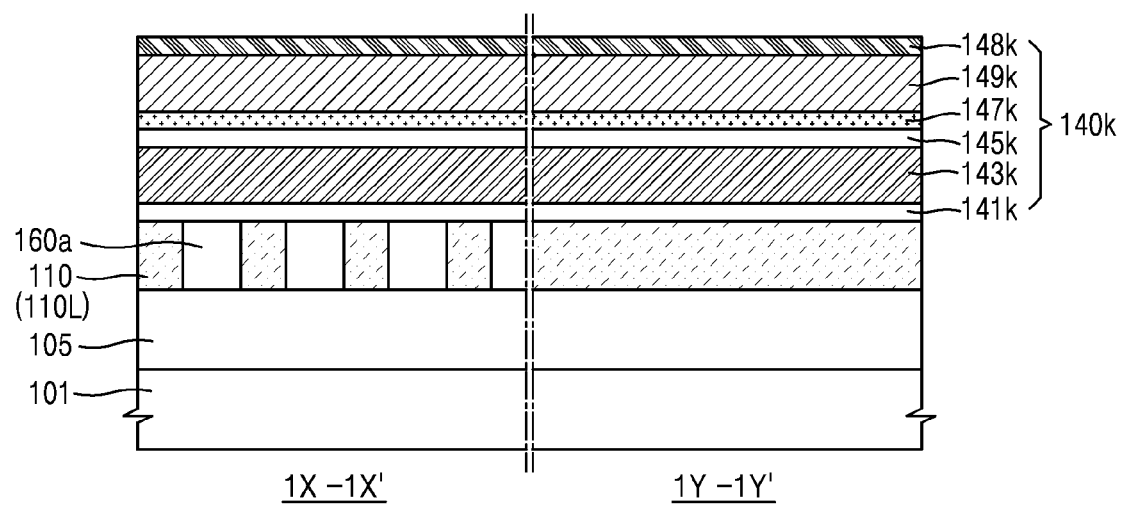
FIGS. 17 to 19 are cross-sectional views illustrating processes of manufacturing the variable resistance memory device, according to an exemplary embodiment.
Figure 18:
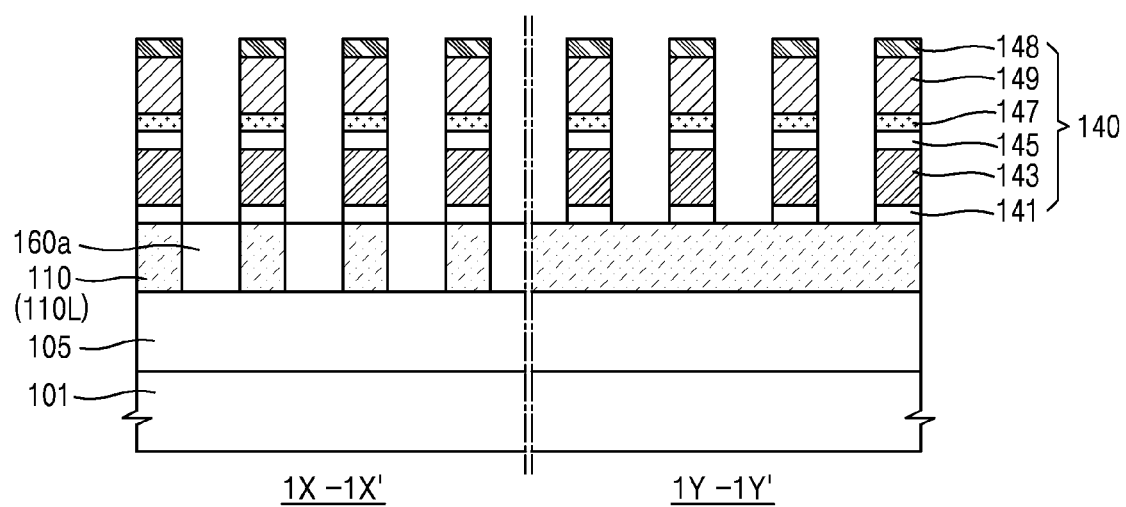
Figure 19:
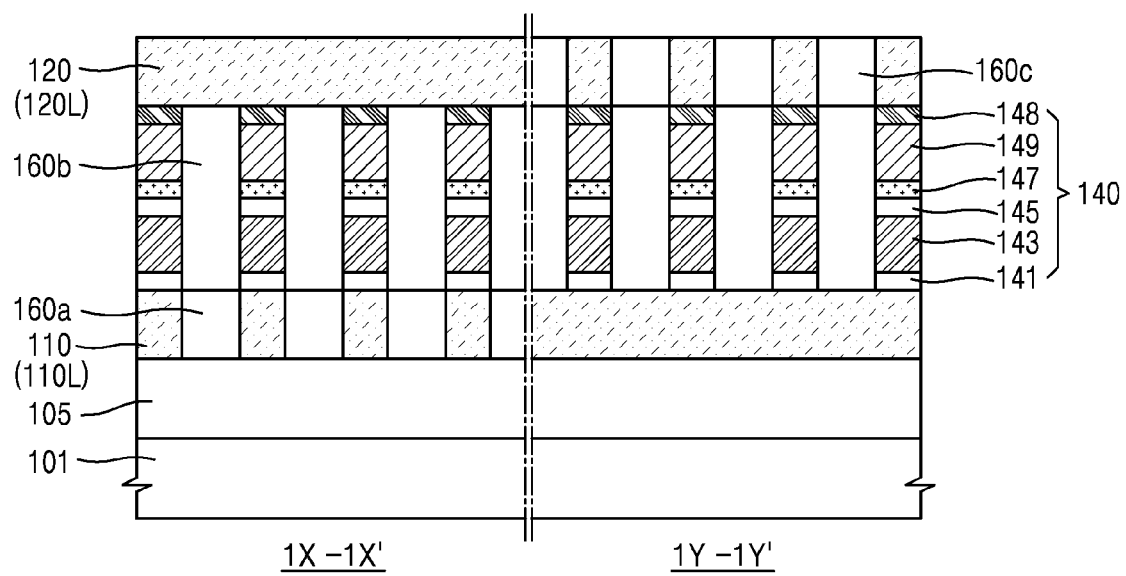

FIGS. 17 to 19 are cross-sectional views illustrating processes of manufacturing the variable memory device illustrated with reference to FIG. 2, according to an exemplary embodiment.

As shown in FIG. 17, the interlayer insulating layer 105 is formed on the substrate 101. The interlayer insulating layer 105 may include, for example, silicon oxide or silicon nitride, but is not limited thereto. The first electrode line layer 110L including the plurality of first electrode lines 110 extending in the first direction (X direction) and spaced apart from one another is formed on the interlayer insulating layer 105. The first electrode lines 110 may be formed by an etching process or damascene process. Materials included in the first electrode lines 110 are described above with reference to FIGS. 2 and 3. The first insulating layer 160a extending in the first direction may be arranged among the first electrode lines 110.

A lower electrode material layer 141k, a selection device material layer 143k, an intermediate electrode material layer 145k, a heating electrode material layer 147k, a variable resistance material layer 149k, and an upper electrode material layer 148k are sequentially stacked on the first electrode line layer 110L and the first insulating layer 160a to form a stack structure 140k. Materials and functions of the material layers included in the stack structure 140k are already described above with reference to FIGS. 2 and 3.

The selection device material layer 143k may be formed by a physical vapour deposition (PVD) process by using a target including a chalcogenide switching material that includes Ge, Si, As, and Te, and selectively includes at least one of Se, C, and N. Otherwise, the selection device material layer 143k may be formed by a chemical vapour deposition (CVD) process or an atomic layer deposition (ALD) process by using a source including a chalcogenide switching material that includes Ge, Si, As, and Te and selectively includes at least one of Se, C, and N.

As shown in FIG. 18, after forming the stack structure 140k (see FIG. 17), mask patterns spaced apart from each other in the first direction (X direction) and the second direction (Y direction) are formed on the stack structure 140k. After that, the stack structure 140k is etched by using the mask patterns so that upper surfaces of the first insulating layer 160a and the first electrode lines 110 are partially exposed to form the plurality of memory cells 140.

The memory cells 140 are spaced apart from each other in the first and second directions according to the shape of the mask patterns, and may be electrically connected to the first electrode lines 110 thereunder. In addition, the memory cells 140 may each include the lower electrode layer 141, the selection device layer 143, the intermediate electrode layer 145, the heating electrode layer 147, the variable resistance layer 149, and the upper electrode layer 148. After forming the memory cells 140, remaining mask patterns are removed by an ashing process and a strip process.

The memory cells 140 may be formed by the etching process, but are not limited thereto. In exemplary embodiments, the memory cells 140 may be formed by the damascene process. For example, when the variable resistance layer 149 in the memory cell 140 is formed by the damascene process, an insulating material layer is formed first and then is etched to form trenches exposing the upper surface of the heating electrode layer 147. After that, a phase change material is filled in the trenches, and then, a planarization is performed by using the CMP process to form the variable resistance layer 149.

As shown in FIG. 19, the second insulating layer 160b filling among the memory cells 140 is formed. The second insulating layer 160b may include the same oxide or nitride material as/or different oxide or nitride material from that of the first insulating layer 160a. An insulating material layer is formed to have a sufficient thickness enough to completely fill spaces between the memory cells 140, and then, planarized by the CMP process to expose the upper surface of the upper electrode layer 148 and to form the second insulating layer 160b.

After that, a conductive layer for forming the second electrode line layer is formed and patterned by an etching process to form the second electrode lines 120. The second electrode lines 120 may extend in the second direction (Y direction) and may be spaced apart from one another. The third insulating layer 160c extending in the second direction may be arranged among the second electrode lines 120. The second electrode lines 120 may be formed by the etching process, but are not limited thereto. For example, the second electrode lines 120 may be formed by the damascene process. When the second electrode lines 120 are formed by the damascene process, an insulating material layer is formed on the memory cells 140 and the second insulating layer 160b, and then, is etched to form trenches extending in the second direction and exposing the upper surface of the variable resistance layer 149. After that, the trenches are filled with a conductive material and planarized to form the second electrode lines 120. If necessary, the insulating material layer filling among the memory cells 140 is formed to be thick and planarized, and then, trenches are formed in the insulating material layer to form the second electrode lines 120. In this case, the second insulating layer and the third insulating layer may be formed as one-body type by using the same material.

While the inventive concepts have been particularly shown and described with reference to exemplary embodiments described herein, it will be understood that various changes in form and details may be made therein without departing from the spirit and scope of the following claims.

We claim:

1. A memory device comprising:
a plurality of first electrode lines formed on a substrate and extending in a first direction that is in parallel with an upper surface of the substrate;
a plurality of second electrode lines formed above the plurality of first electrode lines, and extending in a second direction that is in parallel with the upper surface of the substrate and is different from the first direction;
a plurality of third electrode lines formed above the plurality of first electrode lines, and extending in the first direction; and
a plurality of memory cells respectively formed between the corresponding first and second electrode lines and between the corresponding second and third electrode lines,
wherein each of the plurality of memory cells comprises a selection device layer and a variable resistance layer, and
the selection device layer comprises a chalcogenide switching material having a composition according to chemical formula 1 or chemical formula 3 below, $$[Ge_X Si_Y (As_a Te_{1-a})_Z]_{(1-U)} [N]_U \quad (1)$$

(where $0.05 \leq X \leq 0.1$, $0.15 \leq Y \leq 0.25$, $0.7 \leq Z \leq 0.8$, $X+Y+Z=1$, $0.45 \leq a \leq 0.6$, and $0.08 \leq U \leq 0.2$), $$Ge_X Si_Y As_Z (Te_b Se_{1-b})_W \quad (3)$$

(where $0.05 \leq X \leq 0.1$, $0.15 \leq Y \leq 0.25$, $0.35 \leq Z \leq 0.45$, $0.7 \leq b \leq 1.0$, $0.3 \leq W \leq 0.4$, and $X+Y+Z+W=1$).

2. The memory device of claim 1, wherein the chalcogenide switching material further comprises at least one of nitrogen (N) and carbon (C).

3. The memory device of claim 1, wherein the variable resistance layer has one of a pillar structure, a conical structure, an L-shaped structure, and a dash structure.

4. The memory device of claim 1, wherein each of the plurality of memory cells further comprises a first electrode layer, a second electrode layer, and a third electrode layer, and the selection device layer is arranged between the first electrode layer and the second electrode layer and the variable resistance layer is arranged between the second electrode layer and the third electrode layer.

5. The memory device of claim 4, wherein the first electrode layer, the second electrode layer, and the third electrode layer each comprises at least one selected from carbon (C), titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN).

6. The memory device of claim 1, further comprising a driving circuit region arranged under the plurality of first electrode lines and comprising peripheral circuits or driving circuits for driving the plurality of memory cells.

7. A memory device comprising:
a plurality of word lines extending along a first direction and spaced apart from each other along a second direction that is perpendicular to the first direction;
a plurality of bit lines extending along the second direction and spaced apart from each other in the first direction, the plurality of bit lines being spaced apart from the plurality of word lines in a third direction that is perpendicular to both the first and second directions; and
a plurality of memory cells being respectively arranged between the corresponding word and bit lines, each of the memory cells comprising:
a selection device layer; and
a variable resistance layer,
wherein the selection device layer includes a chalcogenide switching material having a composition according to chemical formula 1 below, $$[Ge_X Si_Y (As_a Te_{1-a})_Z]_{(1-U)}[N]_U \quad (1)$$

(where $0.05 \leq X \leq 0.1$, $0.15 \leq Y \leq 0.25$, $0.7 \leq Z \leq 0.8$, $X+Y+Z=1$, $0.45 \leq a \leq 0.6$, and $0.08 \leq U \leq 0.2$).

8. The memory device of claim 7, wherein the chalcogenide switching material has a composition according to chemical formula 2 below, in which carbon (C) is further added to the chemical formula 1, $$[Ge_X Si_Y (As_a Te_{1-a})_Z]_{(1-U-V)}[N]_U[C]_V \quad (2)$$

(where $0.05 \leq X \leq 0.1$, $0.15 \leq Y \leq 0.25$, $0.7 \leq Z \leq 0.8$, $X+Y+Z=1$, $0.45 \leq a \leq 0.6$, $0.08 \leq U \leq 0.2$, and $0.01 \leq V \leq 0.15$).

9. The memory device of claim 7, wherein the chalcogenide switching material is configured to have ovonic threshold switching characteristics.

10. The memory device of claim 7, wherein the variable resistance layer comprises a chalcogenide material having a different composition from that of the chalcogenide switching material.

11. The memory device of claim 7, wherein the variable resistance layer comprises a super lattice structure including at least one of GeSbTe, InSbTe, and BiSbTe, or including GeTe and SbTe that are repeatedly stacked.

12. The memory device of claim 7, wherein each of the memory cells further comprises:
a lower electrode layer;
an intermediate electrode layer; and
an upper electrode layer,
wherein the selection device layer is arranged between the lower electrode layer and the intermediate electrode layer, and the variable resistance layer is arranged between the upper electrode layer and the intermediate electrode layer.

13. The memory device of claim 12, wherein each of the memory cells further comprises:
a heating electrode layer arranged between the intermediate electrode layer and the variable resistance layer.

14. A memory device comprising:
a plurality of word lines extending along a first direction and spaced apart from each other along a second direction that is perpendicular to the first direction;
a plurality of bit lines extending along the second direction and spaced apart from each other in the first direction, the plurality of bit lines being spaced apart from the plurality of word lines in a third direction that is perpendicular to both the first and second directions; and
a plurality of memory cells being respectively arranged between the corresponding word and bit lines, each of the memory cells comprising:
a selection device layer; and
a variable resistance layer,
wherein the selection device layer includes a chalcogenide switching material having a composition according to chemical formula 3 below, $$Ge_X Si_Y As_Z (Te_b Se_{1-b})_W \quad (3)$$

(where $0.05 \leq X \leq 0.1$, $0.15 \leq Y \leq 0.25$, $0.35 \leq Z \leq 0.45$, $0.7 \leq b \leq 1.0$, $0.3 \leq W \leq 0.4$, and $X+Y+Z+W=1$).

15. The memory device of claim 14, wherein the chalcogenide switching material has a composition according to chemical formula 4 below, which further contains nitrogen (N) in addition to the chemical formula 3, $$[Ge_X Si_Y As_Z (Te_b Se_{1-b})_W]_{(1-U)}[N]_U \quad (4)$$

(where $0.05 \leq X \leq 0.1$, $0.15 \leq Y \leq 0.25$, $0.35 \leq Z \leq 0.45$, $0.7 \leq b \leq 1.0$, $0.3 \leq W \leq 0.4$, $X+Y+Z+W=1$, and $0.08 \leq U \leq 0.2$).

16. The memory device of claim 14, wherein the chalcogenide switching material has a composition according to chemical formula 5 below, which further contains nitrogen (N) and carbon (C) in addition to the chemical formula 3, $$[Ge_X Si_Y As_Z (Te_b Se_{1-b})_W]_{(1-U-V)}[N]_U[C]_V \quad (5)$$

(where $0.05 \leq X \leq 0.1$, $0.15 \leq Y \leq 0.25$, $0.35 \leq Z \leq 0.45$, $0.7 \leq b \leq 1.0$, $0.3 \leq W \leq 0.4$, $X+Y+Z+W=1$, $0.08 \leq U \leq 0.2$, and $0.01 \leq V \leq 0.15$).

17. The memory device of claim 14, wherein each of the memory cells further comprises:
a lower electrode layer;
an intermediate electrode layer; and
an upper electrode layer,
wherein the selection device layer is arranged between the lower electrode layer and the intermediate electrode layer, and the variable resistance layer is arranged between the upper electrode layer and the intermediate electrode layer.

18. The memory device of claim 17, wherein each of the memory cells further comprises:
a heating electrode layer arranged between the intermediate electrode layer and the variable resistance layer.

* * * * *